(12) United States Patent
Koyama et al.

(10) Patent No.: US 8,941,127 B2
(45) Date of Patent: Jan. 27, 2015

(54) FIELD-SEQUENTIAL DISPLAY DEVICE

(75) Inventors: Jun Koyama, Sagamihara (JP);
Toshikazu Kondo, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 780 days.

(21) Appl. No.: 13/070,807

(22) Filed: Mar. 24, 2011

(65) Prior Publication Data
US 2011/0241011 A1 Oct. 6, 2011

(30) Foreign Application Priority Data

Mar. 31, 2010 (JP) .................. 2010-083345

(51) Int. Cl.
| H01L 29/18 | (2006.01) |
| G02F 1/1362 | (2006.01) |
| H01L 27/12 | (2006.01) |
| G09G 3/36 | (2006.01) |
| G02F 1/136 | (2006.01) |
| G02F 1/1335 | (2006.01) |

(52) U.S. Cl.
CPC .... G02F 1/13624 (2013.01); *G09G 2320/0252* (2013.01); *G02F 2001/13606* (2013.01); *G09G 2310/0235* (2013.01); H01L 27/1225 (2013.01); G09G 3/3648 (2013.01); *G02F 2001/133622* (2013.01)
USPC ....................... 257/88; 257/E27.12

(58) Field of Classification Search
USPC .......................... 257/71, 88, E29.274, E27.12
See application file for complete search history.

(56) References Cited

U.S. PATENT DOCUMENTS

| 5,627,557 | A | 5/1997 | Yamaguchi et al. |
| 5,731,856 | A | 3/1998 | Kim et al. |
| 5,744,864 | A | 4/1998 | Cillessen et al. |
| 6,011,530 | A | 1/2000 | Kawahata et al. |

(Continued)

FOREIGN PATENT DOCUMENTS

| EP | 0586155 A | 3/1994 |
| EP | 1737044 A | 12/2006 |

(Continued)

OTHER PUBLICATIONS

International Search Report (Application No. PCT/JP2011/055428) Dated Apr. 12, 2011.

(Continued)

*Primary Examiner* — Tucker Wright
(74) *Attorney, Agent, or Firm* — Eric J. Robinson; Robinson Intellectual Property Law Office, P.C.

(57) ABSTRACT

A first transistor in which an image signal is input to one of a first source and a first drain through an image signal line and a first scan signal is input to the first gate through a first scan signal line; a capacitor whose one of two electrodes is electrically connected to the other of the first source and the first drain of the first transistor; a second transistor in which one of a second source and a second drain is electrically connected to the other of the first source and the first drain of the first transistor and a second scan signal is input to a second gate through a second scan signal line; and a liquid crystal element whose first electrode is electrically connected to the other of the second source and the second drain of the second transistor.

20 Claims, 17 Drawing Sheets

(56) References Cited

U.S. PATENT DOCUMENTS

| | | |
|---|---|---|
| 6,181,311 B1 | 1/2001 | Hashimoto |
| 6,294,274 B1 | 9/2001 | Kawazoe et al. |
| 6,563,174 B2 | 5/2003 | Kawasaki et al. |
| 6,573,882 B1 | 6/2003 | Takabayashi |
| 6,727,522 B1 | 4/2004 | Kawasaki et al. |
| 6,914,643 B1 | 7/2005 | Nagase et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,342,617 B2 | 3/2008 | Tanaka et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,859,510 B2 | 12/2010 | Umezaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0100566 A1 | 5/2008 | Miyasaka et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0136983 A1* | 6/2008 | Huang ............................ 349/38 |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0102752 A1 | 4/2009 | Honda |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140609 A1* | 6/2010 | Yano et al. ....................... 257/43 |
| 2011/0187694 A1 | 8/2011 | Umezaki |
| 2012/0068173 A1 | 3/2012 | Umezaki |

FOREIGN PATENT DOCUMENTS

| | | |
|---|---|---|
| EP | 1895545 A | 3/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-071185 A | 3/1991 |
| JP | 05-251705 A | 9/1993 |
| JP | 06-067151 A | 3/1994 |
| JP | 06-282244 A | 10/1994 |
| JP | 08-264794 A | 10/1996 |
| JP | 09-288261 A | 11/1997 |
| JP | 09-329809 A | 12/1997 |
| JP | 11-505377 | 5/1999 |
| JP | 2000-044236 A | 2/2000 |
| JP | 2000-150900 A | 5/2000 |
| JP | 2000-276110 A | 10/2000 |
| JP | 2000-330087 A | 11/2000 |
| JP | 2001-142096 A | 5/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-083692 A | 4/2008 |
| JP | 2008-134600 A | 6/2008 |
| JP | 2009-042405 | 2/2009 |
| JP | 2009-042405 A | 2/2009 |
| JP | 2009-122657 A | 6/2009 |
| WO | WO-2004/114391 | 12/2004 |

OTHER PUBLICATIONS

Written Opinion (Application No. PCT/JP2011/055428) Dated Apr. 12, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology,", IEDM 0: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.
Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura. K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn—Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties, ", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID

(56) References Cited

OTHER PUBLICATIONS

Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID International Symposium Digest of Technical Papers, May 31, 2009, pp. 395-398.
Lee.H et al., "Current Status of, Challenges to, and Perspective View of AM-OLED ,", IDW '06 : Proceedings of The 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn]at Temperatures over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-2-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using Castep,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

FIELD-SEQUENTIAL DISPLAY DEVICE

TECHNICAL FIELD

One embodiment of the present invention relates to a field-sequential display device.

BACKGROUND ART

In recent years, display devices with field-sequential driving (the display devices also called field-sequential display devices) have been developed. In the field-sequential display device, a unit frame period is divided into a plurality of sub-frame periods and the color of light which enters a pixel is differentiated for each sub-frame period, whereby a full-color image is displayed for each unit frame period. According to the field-sequential display device, the light transmittance is high because of no need of color filter, and the number of pixels can be easily increased because there is no need for a transistor and a display element to be provided for each color. For example, as disclosed in Patent Document 1, in a unit frame period, three sub-frame periods, i.e., a period for displaying an image with red (also called R) light, a period for displaying an image with green (also called G) light, and a period for displaying an image with blue (also called B) light, are provided, and these three images are sequentially displayed, thereby displaying a full-color image.

REFERENCE

Patent Document 1: Japanese Published Patent Application No. 2009-042405

DISCLOSURE OF INVENTION

In the above-described field-sequential display device, an image-data writing operation and an image displaying operation need to be performed plural times in one frame period, which needs high speed operation.

However, the conventional field-sequential display devices are structured such that a conductive layer functioning as a scan signal line through which a scan signal is input overlaps with a conductive layer functioning as an image signal line through which an image signal is input. Therefore, a parasitic capacitance is formed in the overlap between the conductive layer functioning as a scan signal line and the conductive layer functioning as an image signal line, which causes a signal delay, so that the operation speed may be decreased.

An object of one embodiment of the present invention is to increase the operation speed of a field-sequential display device.

According to one embodiment of the present invention, an overlap between a conductive layer functioning as an image signal line through which an image signal is input and a conductive layer functioning as a scan signal line through which a scan signal is input is decreased. Accordingly, formation of the parasitic capacitance due to the overlap is suppressed to reduce signal delay.

One embodiment of the present invention is a field-sequential display device including: an image signal line through which an image signal is input; a first scan signal line; a second scan signal line; a first transistor having a first source, a first drain, and a first gate, in which the image signal is input to one of the first source and the first drain through the image signal line and a first scan signal is input to the first gate through the first scan signal line; a second transistor having a second source, a second drain, and a second gate, in which one of the second source and the second drain is electrically connected to the other of the first source and the first drain of the first transistor and a second scan signal is input to the second gate through the second scan signal line; and a liquid crystal element which has a first electrode, a second electrode, and a liquid crystal layer which is applied with voltage by the first and second electrodes, in which the first electrode is electrically connected to the other of the second source and the second drain of the second transistor. A first conductive layer functioning as the image signal line and a second conductive layer functioning as the second scan signal line, which is spaced from and juxtaposed to the first conductive layer are included in the field-sequential display device.

One embodiment of the present invention is a field-sequential display device including: an image signal line through which an image signal is input; a first scan signal line; a second scan signal line; a third scan signal line; a first transistor having a first source, a first drain, and a first gate, in which the image signal is input to one of the first source and the first drain through the image signal line and a first scan signal is input to the first gate through the first scan signal line; a second transistor having a second source, a second drain, and a second gate, in which one of the second source and the second drain is electrically connected to the other of the first source and the first drain of the first transistor and a second scan signal is input to the second gate through the second scan signal line; a liquid crystal element which has a first electrode, a second electrode, and a liquid crystal layer which is applied with voltage by the first and second electrodes, in which the first electrode is electrically connected to the other of the second source and the second drain of the second transistor; and a third transistor having a third source, a third drain, and a third gate, in which a reset voltage is input to one of the third source and the third drain, the other of the third source and the third drain is electrically connected to the first electrode of the liquid crystal element, and a third scan signal is input to the third gate through the third scan signal line. A first conductive layer functioning as the image signal line, a second conductive layer functioning as the second scan signal line, which is spaced from and juxtaposed to the first conductive layer, and a third conductive layer functioning as the third scan signal line, which is spaced from and juxtaposed to the first conductive layer are included in the field-sequential display device.

In the field-sequential display device of one embodiment of the present invention, the image signal line may function as a wiring through which the reset voltage is input.

According to one embodiment of the present invention, the operation speed of the field-sequential display device can be increased.

BEST MODE FOR CARRYING OUT THE INVENTION

Embodiments of the present invention will be hereinafter described with reference to the accompanying drawings. The present invention is not limited to the following description, and it is easily understood by those skilled in the art that modes and details of the present invention can be modified in various ways without departing from the purpose and scope of the present invention. Accordingly, the present invention is not construed as being limited to the description of the embodiments included herein.

The contents of the embodiments can be appropriately combined with each other or replaced with each other.

Embodiment 1

In Embodiment 1, a field-sequential display device will be described.

The display device of this embodiment includes a pixel. Light of a color which is different per sub-frame period in one frame period enters the pixel. The light enters the pixel from a light source (also called LS), for example.

Figure 1A:
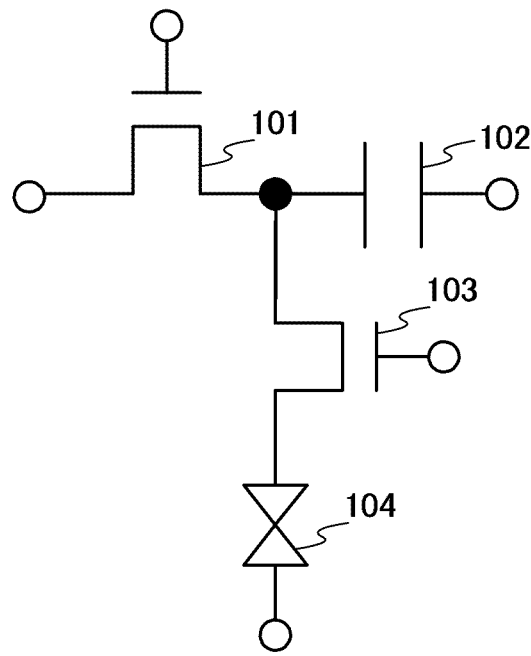
FIGS. 1A and 1B are diagrams illustrating a pixel of a display device in Embodiment 1.
Figure 1B:
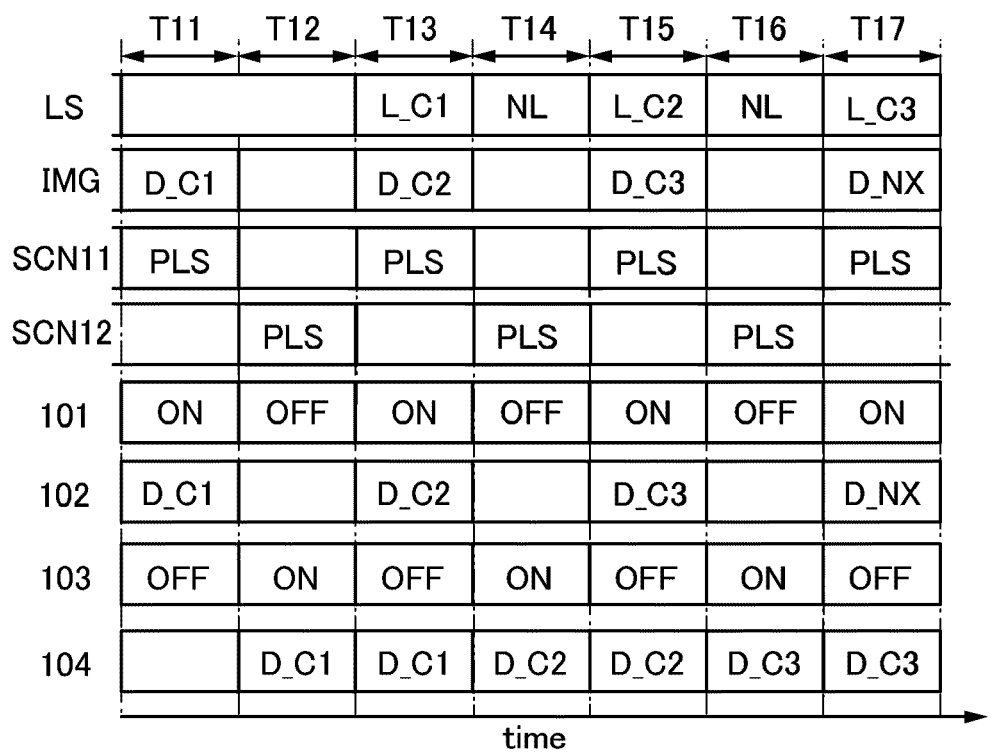

Further, the pixel in the display device of this embodiment is described using FIGS. 1A and 1B. FIGS. 1A and 1B illustrate the pixel in the display device of this embodiment.

First, an example of a circuit configuration of the pixel in the display device of this embodiment is described using FIG. 1A.

A pixel shown in FIG. 1A includes a transistor 101, a capacitor 102, a transistor 103, and a liquid crystal element 104.

In the pixel, the transistor refers to a field-effect transistor, and includes at least a source, a drain, and a gate unless otherwise specified. For example, the transistor includes a conductive layer functioning as a gate, a conductive layer functioning as a source, a conductive layer functioning as a drain, a gate insulating layer provided between the conductive layer functioning as a gate and the conductive layers functioning as a source and a drain, and a semiconductor layer which is electrically connected to the conductive layers functioning as a source and a drain.

The source refers to a part or the whole of a source electrode, or a part or the whole of a source wiring. Further, a conductive layer having functions of both a source electrode and a source wiring is referred to as a source in some cases without distinction between a source electrode and a source wiring.

The drain refers to a part or the whole of a drain electrode, or a part or the whole of a drain wiring. Further, a conductive layer having functions of both a drain electrode and a drain wiring is referred to as a drain in some cases without distinction between a drain electrode and a drain wiring.

The gate refers to a part or the whole of a gate electrode, or a part or the whole of a gate wiring. Further, a conductive layer having functions of both a gate electrode and a gate wiring is referred to as a gate in some cases without distinction between a gate electrode and a gate wiring.

Further, the source and drain of the transistor are interchanged in some cases depending on the structure, operation condition, or the like of the transistor.

Image signal IMG is input to one of a source and a drain of the transistor 101, and a scan signal SCN11 is input to a gate of the transistor 101. The scan signal refers to a signal for controlling the operation of the transistor.

The capacitor 102 has two electrodes. One electrode of the two electrodes of the capacitor 102 is electrically connected to the other of the source and the drain of the transistor 101, and a voltage Va is input to the other electrode of the capacitor 102. The voltage Va is a predetermined voltage. An electric charge in accordance with the image signal IMG is temporarily held in the capacitor 102. The capacity of the capacitor 102 can be determined in accordance with the capacity of the liquid crystal element 104.

In the pixel, the capacitor includes a conductive layer functioning as one electrode, a conductive layer functioning as the other electrode, and a dielectric layer which overlaps with the two electrodes.

Generally, voltage refers to a difference between potentials at two points (also referred to as a potential difference). However, values of both a voltage and a potential are represented by a unit, volt (V) in a circuit diagram or the like in some cases, so that it is difficult to discriminate them. Therefore, in this specification, a potential difference between a potential at one point and a potential as a reference (also referred to as a reference potential) is used as a voltage at that one point in some cases.

One of a source and a drain of the transistor 103 is electrically connected to the other of the source and the drain of the transistor 101, and a scan signal SCN12 is input to a gate of the transistor 103.

As the transistors 101 and 103, for example, transistors including an oxide semiconductor layer or a semiconductor layer using a semiconductor (e.g., silicon) belonging to Group 14 in the periodic table can be used. The semiconductor layer or the oxide semiconductor layer functions as a channel formation layer of the transistor. The oxide semiconductor layer is highly purified to be an intrinsic (also called an I-type) or substantially intrinsic semiconductor layer. Note that the high purification means at least one of the following concepts: removal of hydrogen from an oxide semiconductor layer as much as possible; and reduction of defects, which are caused by oxygen deficiency in an oxide semiconductor layer, by supply of oxygen to the oxide semiconductor layer.

The band gap of the oxide semiconductor layer is 2 eV or more, preferably 2.5 eV or more, far preferably 3 eV or more.

Therefore, the number of carriers generated by thermal excitation can be ignored. Further, the amount of impurity such as hydrogen which may form a donor is decreased to a certain amount or less, and the carrier concentration of the oxide semiconductor layer is less than $1\times10^{14}/cm^3$, preferably $1\times10^{12}/cm^3$ or less. That is, the carrier concentration of the oxide semiconductor layer is zero or substantially zero.

In addition, with the use of the oxide semiconductor layer in the transistor, the leakage current of the transistor in the off-state (also called an off-state current) per micrometer of the channel width can be reduced to 10 aA ($1\times10^{-17}$ A) or less, further reduced to 1 aA ($1\times10^{-18}$ A) or less, still further reduced to 10 zA ($1\times10^{-20}$ A) or less. Accordingly, the effect of the off-state current of the transistor can be reduced.

Further, in the transistor including the oxide semiconductor layer, degradation caused by light (e.g., variation in the threshold voltage) is little. Accordingly, with the use of the transistor including the oxide semiconductor layer, degradation caused by light of a plurality of colors can be reduced.

In this manner, since the effect of the off-state current of the transistor can be reduced with the transistor including the oxide semiconductor layer, for example, variations of voltages applied to the capacitor and the liquid crystal element due to the off-state current of the transistor can be reduced.

The liquid crystal element 104 has a first electrode and a second electrode. The first electrode of the liquid crystal element 104 is electrically connected to the other of the source and the drain of the transistor 103, and a voltage Vb is input to the second electrode of the liquid crystal element 104. The voltage Vb is a predetermined voltage and may be the same as the voltage Va. One of the two electrodes of the capacitor may be referred to as a third electrode and the other electrode may be referred to as a fourth electrode.

In the pixel, the liquid crystal element includes, for example, a conductive layer functioning as the first electrode, a conductive layer functioning as the second electrode, and a liquid crystal layer to which a voltage is applied between the first electrode and the second electrode.

Examples of a display mode for the liquid crystal element are the following: a TN (twisted nematic) mode, an IPS (in-plane-switching) mode, a VA (vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, an ASV, and the like. The display mode is not limited to those described above, and may be an FFS (fringe field switching) mode or the like.

As the liquid crystal layer included in the liquid crystal element, for example, a liquid crystal layer exhibiting a blue phase for which an alignment film is not needed may be used. The liquid crystal layer exhibiting a blue phase contains, for example, a liquid crystal composition including a liquid crystal exhibiting a blue phase and a chiral agent. The liquid crystal layer exhibiting a blue phase has a short response time of 1 msec or less, has optical isotropy, which makes the alignment process unnecessary, and has a low viewing angle dependence. Therefore, with the liquid crystal element using the liquid crystal layer exhibiting a blue phase, the operation speed can be increased. For example, the filed-sequential display device in this embodiment needs to have higher operation speed than a display device using a color filter, and therefore, it is preferable that the liquid crystal exhibiting a blue phase be used in the liquid crystal element in the filed-sequential display device in this embodiment.

Further, the pixel has an image signal line through which the image signal IMG is input and a scan signal line through which a scan signal SCN12 is input. The image signal line and the scan signal line are spaced from each other when seen in a planar view of the pixel. That is, the image signal line and the scan signal line are conductive layers provided over one layer having an insulating surface, and are spaced from and juxtaposed to each other when seen in the planar view of the pixel. For example, the image signal line and the scan signal line may be juxtaposed in parallel or substantially parallel to each other with a space provided therebetween when seen in the planar view of the pixel. The pixel may have a conductive layer functioning as an image signal line through which an image signal IMG is input and a conductive layer which functions as a scan signal line through which a scan signal SCN12 is input and is provided in parallel or substantially parallel to the image signal line when seen in the planar view of the pixel. The expression of being "substantially parallel" to something is synonymous to being "parallel" to something virtually.

Further, in the pixel of the display device of this embodiment, the conductive layer functioning as the image signal line may function as one of the source and the drain of the transistor 101. In the pixel of the display device of this embodiment, the conductive layer functioning as the image signal line may be electrically connected to another conductive layer functioning as an image signal line and as one of the source and the drain of the transistor 101.

In the pixel of the display device of this embodiment, the conductive layer functioning as the scan signal line through which the scan signal SCN12 is input may function as the gate of the transistor 103. In the pixel of the display device of this embodiment, the conductive layer functioning as the scan signal line through which the scan signal SCN12 is input may be electrically connected to a conductive layer functioning as another scan signal line through which the scan signal SCN12 is input and as the gate of the transistor 103.

Further, the pixel of the display device of this embodiment may be provided with a storage capacitor which is electrically connected to the liquid crystal element 104 in parallel. With the storage capacitor, the effect of the off-state current of the transistors 101 and 103 can be further reduced. Alternatively, no storage capacitor may be provided for the pixel of the display device of this embodiment. Omission of the storage capacitor leads to an improvement in the aperture ratio of the pixel.

Next, as an example of a method for driving the pixel of the display device of this embodiment, an example of a method for driving the pixel shown in FIG. 1A is described using FIG. 1B. Description here is made on the operation in one frame period as one example.

As shown in FIG. 1B, in a period T11, a pulse of the scan signal SCN11 (also referred to as PLS) is input to the gate of the transistor 101.

Consequently, the transistor 101 is turned on (also referred to as ON), and the image signal IMG corresponding to image data D_C1 of a first color C1 is input to the third electrode of the capacitor 102, so that a voltage on the basis of the image data D_C1 is applied to the capacitor 102.

Next, in a period T12, a pulse of the scan signal SCN12 is input to the gate of the transistor 103.

Consequently, the transistor 103 is turned on, and the transistor 101 is turned off (also referred to as OFF). Consequently, an electric charge accumulated in the third electrode of the capacitor 102 moves to the first electrode of the liquid crystal element 104, so that a voltage on the basis of the image data D_C1 is applied to the liquid crystal element 104.

Next, in a period T13, the transistor 103 is turned off, the light of the first color C1 enters the liquid crystal element 104, and the liquid crystal element 104 transmits the light of the first color C1 at a transmittance on the basis of the image data D_C1, thereby setting a display state of the pixel. The period during which light enters the pixel is also called a display period. The state where the light of the first color C1 enters is also referred to as L_C1.

Further, in the period T13, the pulse of the scan signal SCN11 is input to the gate of the transistor 101. Consequently, the transistor 101 is turned on, and the image signal IMG corresponding to image data D_C2 of a second color C2 is input to the third electrode of the capacitor 102, so that a voltage on the basis of the image data D_C2 is applied to the capacitor 102.

Next, in a period T14, the light is stopped entering the liquid crystal element 104, and the pulse of the scan signal SCN12 is input to the gate of the transistor 103. The state where the light is stopped entering is also called a non-light emission state (also referred to as NL).

Consequently, the transistor 103 is turned on, and the transistor 101 is turned off. Consequently, an electric charge accumulated in the third electrode of the capacitor 102 moves to the first electrode of the liquid crystal element 104, so that a voltage on the basis of the image data D_C2 is applied to the liquid crystal element 104.

Next, in a period T15, the transistor 103 is turned off, the light of the second color C2 enters the liquid crystal element 104, and the liquid crystal element 104 transmits the light of the second color C2 at a transmittance on the basis of the image data D_C2, thereby setting a display state of the pixel.

Further, in the period T15, the pulse of the scan signal SCN11 is input to the gate of the transistor 101.

Consequently, the transistor 101 is turned on, and the image signal IMG corresponding to image data D_C3 of a third color C3 is input to the third electrode of the capacitor 102, so that a voltage on the basis of the image data D_C3 is applied to the capacitor 102.

Next, in a period T16, the light is stopped entering the liquid crystal element 104, and the pulse of the scan signal SCN12 is input to the gate of the transistor 103.

Consequently, the transistor 103 is turned on, and the transistor 101 is turned off. Consequently, an electric charge accumulated in the third electrode of the capacitor 102 moves to the first electrode of the liquid crystal element 104, so that a voltage on the basis of the image data D_C3 is applied to the liquid crystal element 104.

Next, in a period T17, the transistor 103 is turned off, the light of the third color C3 enters the liquid crystal element 104, and the liquid crystal element 104 transmits the light of the third color C3 at a transmittance on the basis of the image data DS3, thereby setting a display state of the pixel.

Further, in the period T17, the pulse of the scan signal SCN11 is input to the gate of the transistor 101.

Consequently, the transistor 101 is turned on, and the image signal IMG corresponding to image data D_NX of the next color is input to the third electrode of the capacitor 102, so that a voltage on the basis of the image data D_NX is applied to the capacitor 102. The image data D_NX is the image data D_C1 of the first color C1 or the image data of another color. In this manner, a full-color image is displayed in one frame period. The above is an example of the method for driving the pixel shown in FIG. 1A.

As the three colors, i.e., the first color C1, the second color C2, and the third color C3, red, green, and blue (RGB) can be used. They are not limited to these colors; cyan, magenta, and yellow can be used as the first color C1, the second color C2, and the third color C3. Further, the number of colors is not limited to three; for example, four colors may be used by adding any other color such as white to the three colors.

Further, in the case where the display device of this embodiment is provided with a plurality of pixels arranged in matrix, it is preferable that the writing operation of image data into the capacitor 102 in each pixel (the operation in each of the period T11, the period T13, the period T15, and the period T17 in FIG. 1B) be performed per row, and the moving operation of an electric charge into the liquid crystal element 104 in each pixel (the operation in each of the period T12, the period T14, and the period T16 in FIG. 1B) be performed all at once. Accordingly, the period of time for the moving operation of electric charge into the liquid crystal element 104 in each pixel can be decreased.

As described using FIGS. 1A and 1B, the display device of this embodiment is provided with the pixel which includes the first transistor, the second transistor, the liquid crystal element, and the capacitor for temporarily holding data of the image signal IMG, in which the first transistor is turned on to apply the data voltage of the image signal IMG to the capacitor, and the second transistor is turned on to move the electric charge accumulated in the capacitor into the liquid crystal element, so that the data voltage of the image signal IMG is applied to the liquid crystal element. According to this structure, during a period in which a display is performed by the pixel, the next image data can be written into the pixel. Accordingly, the period of time for displaying one image can be reduced without shortening the display period, whereby the operation speed of the display device can be increased.

The pixel of the display device of this embodiment further has the first conductive layer functioning as the image signal line through which the image signal IMG is input and the second conductive layer functioning as the scan signal line through which the scan signal SCN12 is input, which is spaced from and juxtaposed to the first conductive layer when seen in a planar view of the pixel. According to this structure, the number of overlaps between the image signal line and the scan signal line can be reduced to decrease a parasitic capacitance of the image signal line, so that a delay of the image signal can be decreased, whereby the operation speed of the display device can be increased.

Embodiment 2

In Embodiment 2, an example of a structure of the pixel in the display device described in Embodiment 1 will be described.

The pixel in the display device described in Embodiment 1 includes a first substrate (also called an active matrix substrate) provided with a semiconductor element such as a transistor, a second substrate (also called a counter substrate), and a liquid crystal layer provided between the active matrix substrate and the counter substrate.

Figure 2A:
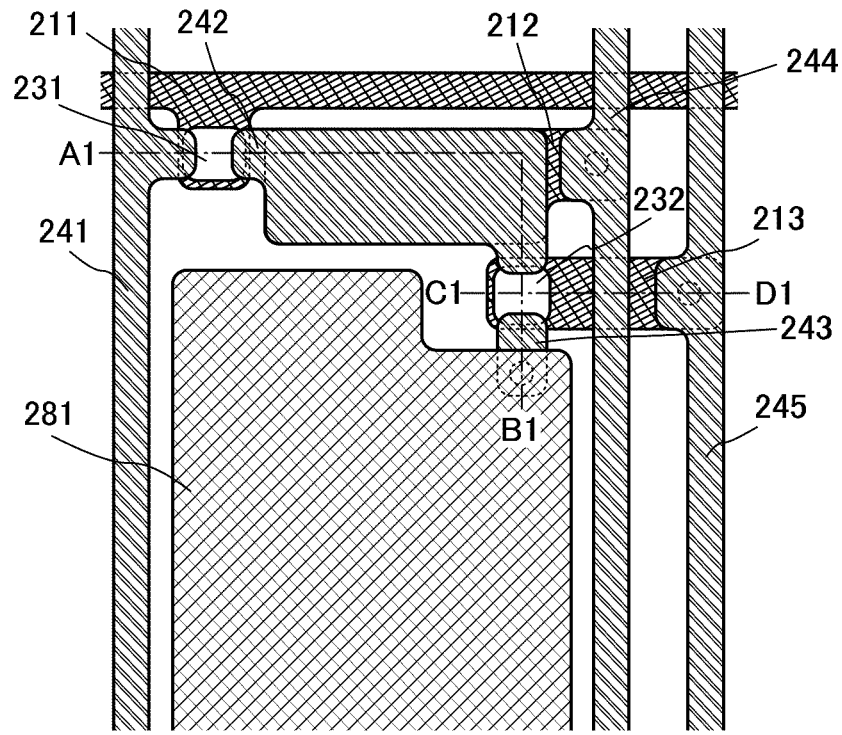
FIGS. 2A to 2C are schematic diagrams illustrating a structural example of an active-matrix substrate in the display device in Embodiment 1.
Figure 2B:
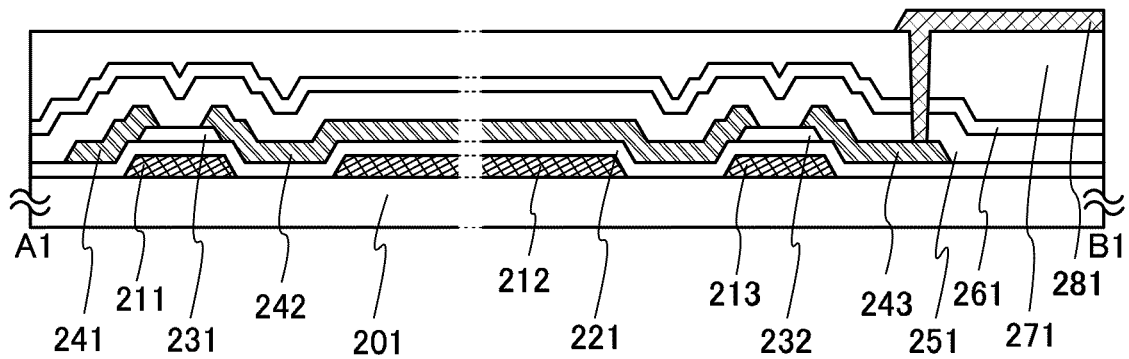
Figure 2C:
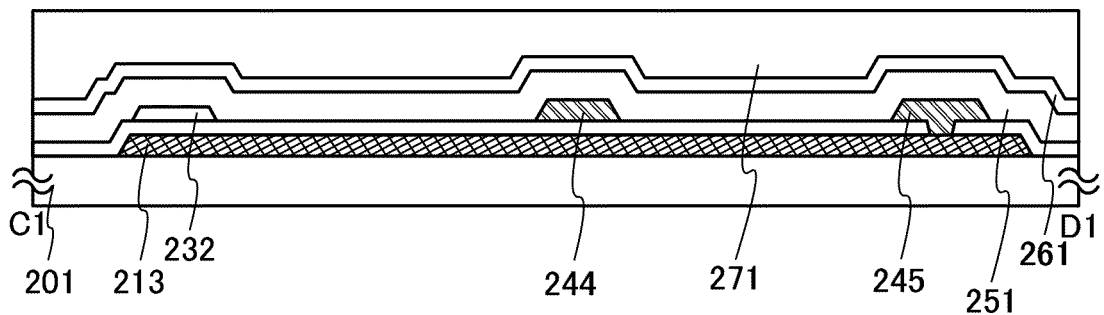

Further, a structural example of the active matrix substrate in the display device described in Embodiment 1 is described using FIGS. 2A to 2C. FIGS. 2A to 2C are schematic diagrams illustrating the structural example of the active matrix substrate in the display device described in Embodiment 1: FIG. 2A is a plan schematic diagram; FIG. 2B is a cross-sectional schematic diagram along line A1-B1 in FIG. 2A; and FIG. 2C is a cross-sectional schematic diagram along line C1-D1 in FIG. 2A.

The active matrix substrate shown in FIGS. 2A to 2C has a substrate 201, conductive layers 211, 212, and 213, an insulating layer 221, semiconductor layers 231 and 232, conductive layers 241, 242, 243, 244, and 245, an oxide insulating layer 251, a protective insulating layer 261, a planarization insulating layer 271, and a conductive layer 281.

The conductive layers 211, 212, and 213 are provided for one surface of the substrate 201. The conductive layer 211 functions as the scan signal line through which the scan signal SCN11 is input and functions as the gate of the transistor 101 shown in FIG. 1A. The conductive layer 212 functions as the fourth electrode of the capacitor 102 shown in FIG. 1A and functions as the wiring through which the voltage Va is input. The conductive layer 213 functions as the scan signal line through which the scan signal SCN12 is input and functions as the gate of the transistor 103 shown in FIG. 1A.

The insulating layer 221 is provided for one surface of the substrate 201 with the conductive layers 211 to 213 provided therebetween. The insulating layer 221 functions as the gate insulating layer of the transistor 101 shown in FIG. 1A, as the dielectric layer of the capacitor 102 shown in FIG. 1A, and as the gate insulating layer of the transistor 103 shown in FIG. 1A.

The semiconductor layer 231 is provided over the conductive layer 211 with the insulating layer 221 provided therebetween. The semiconductor layer 231 functions as the channel formation layer of the transistor 101 shown in FIG. 1A.

The semiconductor layer 232 is provided over the conductive layer 213 with the insulating layer 221 provided therebetween. The semiconductor layer 232 functions as the channel formation layer of the transistor 103 shown in FIG. 1A.

The conductive layer 241 is electrically connected to the semiconductor layer 231. The conductive layer 241 functions as the image signal line through which the image signal IMG is input and as one of the source and the drain of the transistor 101 shown in FIG. 1A.

The conductive layer 242 is electrically connected to the semiconductor layers 231 and 232. The conductive layer 242 is provided over the conductive layer 212 with the insulating layer 221 provided therebetween. The conductive layer 242 functions as the other of the source and the drain of the transistor 101 shown in FIG. 1A, as the third electrode of the capacitor 102 show in FIG. 1A, and as one of the source and the drain of the transistor 103 shown in FIG. 1A.

The conductive layer 243 is electrically connected to the semiconductor layer 232. The conductive layer 243 functions as the other of the source and the drain of the transistor 103 shown in FIG. 1A.

The conductive layer 244 is provided over the conductive layer 212 with the insulating layer 221 provided therebetween, and is electrically connected to the conductive layer 212 through an opening formed in the insulating layer 221. The conductive layer 244 functions as the wiring through which the voltage Va is input.

The conductive layer 245 is provided over the conductive layer 213 with the insulating layer 221 provided therebetween, and is electrically connected to the conductive layer 213 through an opening formed in the insulating layer 221. The conductive layer 245 functions as the scan signal line through which the scan signal SCN12 is input.

The oxide insulating layer 251 is provided over the insulating layer 221 with the semiconductor layers 231 and 232 and the conductive layers 241 to 245 provided therebetween.

The protective insulating layer 261 is provided over the oxide insulating layer 251.

The planarization insulating layer 271 is provided over the protective insulating layer 261.

The conductive layer 281 is provided over the planarization insulating layer 271, and is electrically connected to the conductive layer 243 through an opening formed in the oxide insulating layer 251, the protective insulating layer 261, and the planarization insulating layer 271. The conductive layer 281 functions as the first electrode of the liquid crystal element 104 shown in FIG. 1A.

Further, in the active matrix substrate shown in FIGS. 2A to 2C, all of the conductive layers 213 and 245 are spaced from the conductive layer 241 when seen in a planar view; that is, the conductive layers 213 and 245 are spaced from and juxtaposed to the conductive layer 241, or the conductive layers 213 and 245 do not overlap with the conductive layer 241. In the active matrix substrate shown in FIGS. 2A to 2C, all of the conductive layers 212 and 244 are spaced from the conductive layer 241 when seen in the planar view; that is, the conductive layers 212 and 244 are spaced from and juxtaposed to the conductive layer 241, or the conductive layers 212 and 244 do not overlap with the conductive layer 241.

Figure 3:
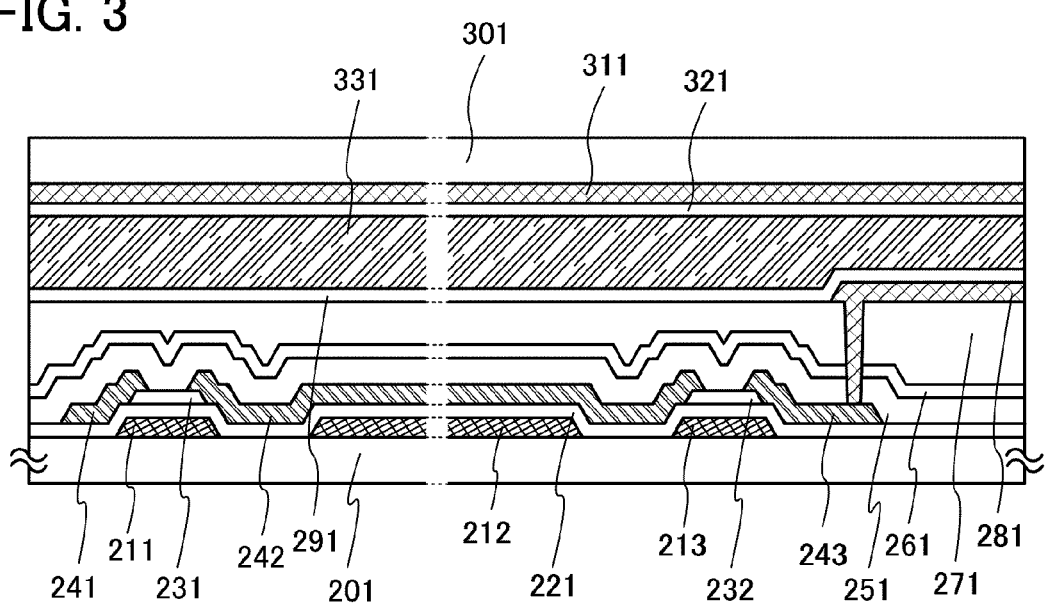
FIG. 3 is a cross-sectional schematic diagram illustrating a structural example of a pixel in Embodiment 2.

Further, a structural example of the pixel in the display device of this embodiment is described using FIG. 3. FIG. 3 is a cross-sectional schematic diagram illustrating the structural example of the pixel in the display device of this embodiment.

A display device shown in FIG. 3 has a substrate 301, a conductive layer 311, an insulating layer 321, and a liquid crystal layer 331 in addition to the active matrix substrate shown in FIGS. 2A to 2C.

The display device shown in FIG. 3 has an insulating layer 291 over the planarization insulating layer 271 with the conductive layer 281 provided therebetween.

The conductive layer 311 is provided for one surface of the substrate 301. The conductive layer 311 functions as the second electrode of the liquid crystal element 104 shown in FIG. 1A.

The insulating layer 321 is provided for one surface of the conductive layer 311.

The liquid crystal layer 331 is provided between the conductive layer 281 and the conductive layer 311 with the insulating layer 291 and the insulating layer 321 provided therebetween. The liquid crystal layer 331 functions as the liquid crystal layer of the liquid crystal element 104 shown in FIG. 1A.

As the substrates 201 and 301, glass substrates of barium borosilicate glass, aluminoborosilicate glass, or the like can be used, for example.

Alternatively, a ceramic substrate, a quartz substrate, a sapphire substrate, or the like can be used as any of the substrates 201 and 301. A crystallized glass substrate can be used as any of the substrates 201 and 301. Further alternatively, a plastic substrate can be used as any of the substrates 201 and 301. Further alternatively, a semiconductor substrate of silicon or the like can be used as any of the substrates 201 and 301.

As any of the conductive layers 211 to 213, for example, a layer of a metal material such as molybdenum, titanium, chromium, tantalum, tungsten, aluminum, copper, neodymium, or scandium, or an alloy material containing any of these materials as a main component can be used. Further, a stack of layers of materials each applicable to the conductive layers 211 to 213 can be used to form any of the conductive layers 211 to 213.

As the insulating layer 221, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. Further, a stack of layers of materials each applicable to the insulating layer 221 can be used to form the insulating layer 221. The layers of materials applicable to the insulating layer 221 can be formed by a plasma CVD method, a sputtering method, or the like. For example, the insulating layer 221 can be formed in the following manner: a silicon nitride layer is formed by a plasma CVD method, and a silicon oxide layer is formed over the silicon nitride layer by a plasma CVD method.

As any of the semiconductor layers 231 and 232, a semiconductor layer using a semiconductor (e.g., silicon) belonging to Group 14 in the periodic table or an oxide semiconductor layer can be used. In FIGS. 2A to 2C, oxide semiconductor layers are used as the semiconductor layers 231 and 232 as an example. As examples of the oxide semiconductor, a four-component metal oxide, a three-component metal oxide, a two-component metal oxide, and the like can be given. As an example of the four-component metal oxide, an In—Sn—Ga—Zn—O-based metal oxide can be given. As examples of the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, and a Sn—Al—Zn—O-based metal oxide can be given. As examples of the two-component metal oxide, an In—Ga—O-based metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, and an In—Sn—O-based metal oxide can be given. Further, as examples of the oxide semiconductor, an In—O-based metal oxide, a Sn—O-based metal oxide, and a Zn—O-based metal oxide can be used. The metal oxide that can be used as the oxide semiconductor may contain $SiO_2$. For example, the In—Ga—Zn—O-based metal oxide means an oxide containing at least In, Ga, and Zn, and the composition ratio of the elements is not particularly limited. The In—Ga—Zn—O-based metal oxide may contain an element other than In, Ga, and Zn.

Further, as an example of the oxide semiconductor, a metal oxide represented by the chemical formula, $InMO_3(ZnO)_n$, (m is a number larger than zero) can be given. Here, M represents one or more metal elements selected from Ga, Al, Mn, and Co. For example, Ga, a combination of Ga and Al, a combination of Ga and Mn, a combination of Ga and Co, and the like can be given as examples of M.

As any of the semiconductor layers 231 and 232, a semiconductor layer using a semiconductor (e.g., silicon) belonging to Group 14 in the periodic table can be used as well.

As any of the conductive layers 241 to 245, for example, a layer of a metal material such as aluminum, chromium, copper, tantalum, molybdenum, or tungsten, or an alloy material containing any of these materials as a main component can be used. Further, a stack of layers of materials each applicable to the conductive layers 241 to 245 can be used to form any of the conductive layers 241 to 245.

For example, each of the conductive layers 241 to 245 can be formed by stacking a metal layer of aluminum or copper and a high-melting-point metal layer of titanium, molybdenum, tungsten, or the like. The conductive layers 241 to 245 each can have a structure in which a metal layer of aluminum or copper is provided between a plurality of high-melting-point metal layers. Any of the conductive layers 241 to 245 can be formed using an aluminum layer to which an element that prevents generation of hillocks or whiskers (e.g., Si, Nd, or Si) is added, so that heat resistance can be increased.

Further, a layer containing a conductive metal oxide can be used as any of the conductive layers 241 to 245. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or such a metal oxide material containing silicon oxide can be used, for example.

As the oxide insulating layer 251, a silicon oxide layer or the like can be used, for example. A stack of layers of materials each applicable to the oxide insulating layer 251 can be used to form the oxide insulating layer 251.

As the protective insulating layer 261, for example, an inorganic insulating layer such as a silicon nitride layer, an aluminum nitride layer, a silicon nitride oxide layer, or an aluminum nitride oxide layer can be used. A stack of layers of materials each applicable to the protective insulating layer 261 can be used to form the protective insulating layer 261.

As the planarization insulating layer 271, a layer of an organic material such as polyimide, acrylic, or benzocyclobutene can be used. A layer of a low-dielectric constant material (a low-k material) can also be used as the planarization insulating layer 271. The planarization insulating layer 271 can also be formed by stacking layers of materials each applicable to the planarization insulating layer 271.

As any of the conductive layers 281 and 311, a layer of a light-transmitting conductive material such as indium tin oxide, a metal oxide in which zinc oxide is mixed in indium oxide (also referred to as indium zinc oxide (IZO)), a conductive material in which silicon oxide ($SiO_2$) is mixed in indium oxide, organoindium, organotin, indium oxide containing tungsten oxide, indium zinc oxide containing tungsten oxide, indium oxide containing titanium oxide, indium tin oxide containing titanium oxide, or the like can be used. Further, a stack of layers of materials each applicable to the conductive layers 281 and 311 can be used to form any of the conductive layers 281 and 311.

A conductive composition containing a conductive macromolecule (also referred to as a conductive polymer) can be used to form any of the conductive layers 281 and 311. The conductive layer using the conductive composition preferably has a sheet resistance of 10000 ohms per square or less and a transmittance of 70% or more at a wavelength of 550 nm. Furthermore, the resistivity of the conductive macromolecule contained in the conductive composition is preferably less than or equal to 0.1 Ω·cm.

As the conductive macromolecule, a so-called t-electron conjugated conductive polymer can be used. As the π-electron conjugated conductive polymer, polyaniline or a derivative thereof, polypyrrole or a derivative thereof, polythiophene or a derivative thereof, or a copolymer of two or more of aniline, pyrrole, and thiophene or a derivative thereof can be given.

As any of the insulating layers 291 and 321, a layer of the material applicable to the insulating layer 221 can be used. A stack of layers of the material each applicable to the insulating layer 221 can be used to form any of the insulating layers 291 and 321.

For the liquid crystal layer 331, for example, TN liquid crystal, OCB liquid crystal, STN liquid crystal, VA liquid crystal, ECB liquid crystal, GH liquid crystal, polymer dispersed liquid crystal, or discotic liquid crystal can be used.

As described using FIGS. 2A to 2C and FIG. 3, the pixel in the display device of this embodiment has the structure in which the first and second transistors are bottom-gate transistors and the image signal line through which an image signal is input (e.g., the conductive layer 241 shown in FIGS. 2A to 2C) and the scan signal line through which a scan signal (the scan signal SCN12) is input (e.g., the conductive layer 213 or the conductive layers 213 and 245 shown in FIGS. 2A to 2C) are spaced from each other (spaced from and juxtaposed to each other) when seen in a planar view of the pixel. With this structure, there is no overlap between the first conductive layer and the second conductive layer, so that the parasitic capacitance of the image signal line can be decreased to reduce a delay of an image signal, whereby the operation speed of the display device can be improved.

Embodiment 3

In Embodiment 3, a structural example of an active matrix substrate, which is different from that in Embodiment 2 will be described.

Figure 4A:
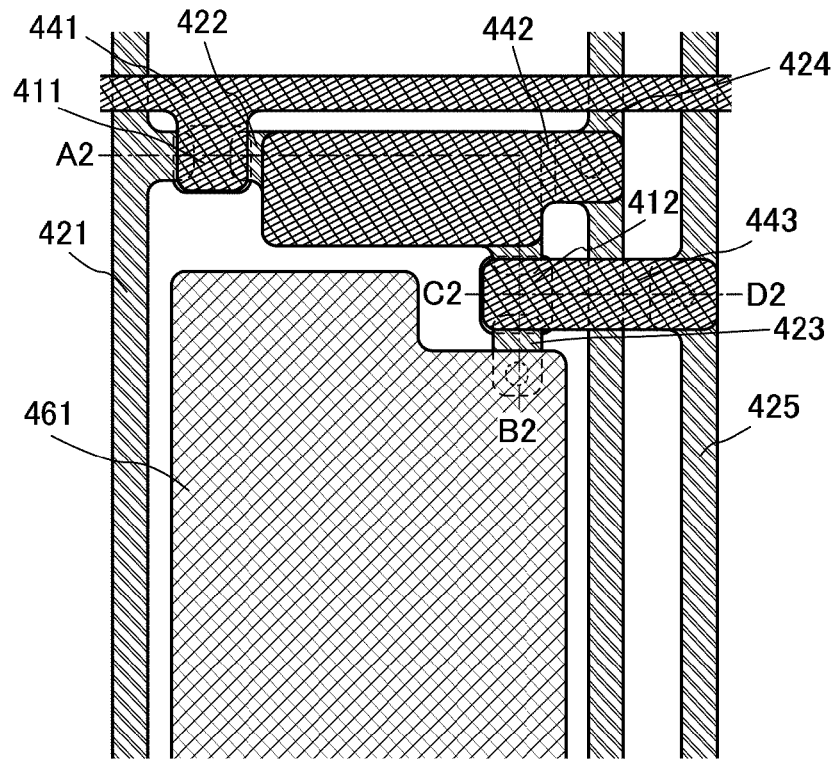
FIGS. 4A to 4C are schematic diagrams illustrating a structural example of an active-matrix substrate in the display device in Embodiment 1.
Figure 4B:
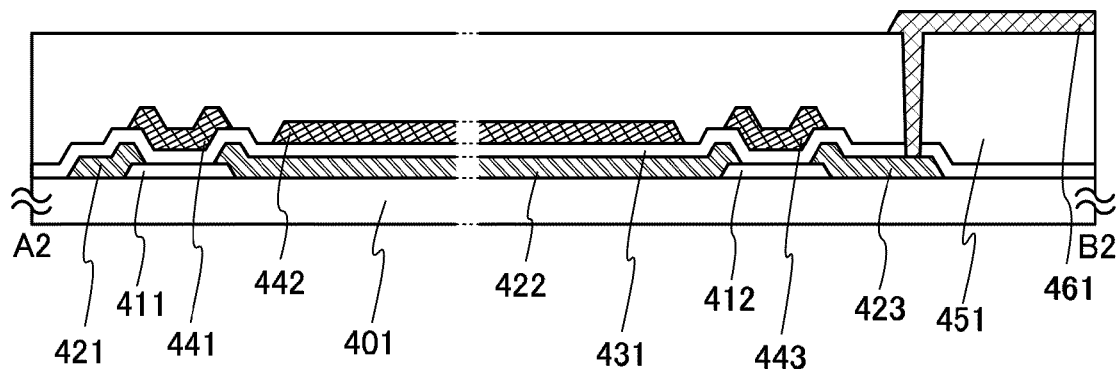
Figure 4C:
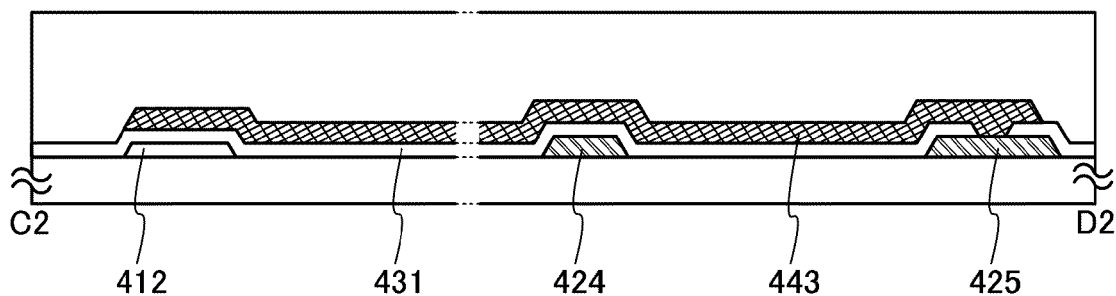

A structural example of the active matrix substrate in the display device of this embodiment is described using FIGS. 4A to 4C. FIGS. 4A to 4C are schematic diagrams illustrating the structural example of the active matrix substrate in the display device described in Embodiment 1: FIG. 4A is a plan schematic diagram; FIG. 4B is a cross-sectional schematic diagram along line A2-B2 in FIG. 4A; and FIG. 4C is a cross-sectional schematic diagram along line C2-D2 in FIG. 4A.

An active matrix substrate shown in FIGS. 4A to 4C has semiconductor layers 411 and 412, conductive layers 421, 422, and 423, an insulating layer 431, conductive layers 441, 442, and 443, a planarization insulating layer 451, and a conductive layer 461.

The semiconductor layers 411 and 412 are provided for one surface of a substrate 401. The semiconductor layer 411 functions as the channel formation layer of the transistor 101 shown in FIG. 1A.

The conductive layer 421 is electrically connected to the semiconductor layer 411. The conductive layer 421 functions as an image signal line through which an image signal IMG is input and as one of the source and the drain of the transistor 101 shown in FIG. 1A.

The conductive layer 422 is electrically connected to the semiconductor layers 411 and 412. The conductive layer 422 functions as the other of the source and the drain of the transistor 101 shown in FIG. 1A and as the third electrode of the capacitor 102 show in FIG. 1A.

The conductive layer 423 is electrically connected to the semiconductor layer 412. The conductive layer 423 functions as the other of the source and the drain of the transistor 103 shown in FIG. 1A.

The conductive layer 424 is provided over the substrate 401. The conductive layer 424 functions as a wiring through which a voltage Va is input.

The conductive layer 425 is provided over the substrate 401. The conductive layer 425 functions as a scan signal line through which a scan signal SCN12 is input.

The insulating layer 431 is provided over the substrate 401 with the semiconductor layers 411 and 412 and the conductive layers 421 to 425 provided therebetween. The insulating layer 431 functions as the gate insulating layer of the transistor 101 shown in FIG. 1A, as the dielectric layer of the capacitor 102 shown in FIG. 1A, and as the gate insulating layer of the transistor 103 shown in FIG. 1A.

The conductive layer 441 is provided over the semiconductor layer 411 with the insulating layer 431 provided therebetween. The conductive layer 441 functions as a scan signal line through which a scan signal SCN11 is input and functions as the gate of the transistor 101 shown in FIG. 1A.

The conductive layer 442 is provided over the conductive layers 422 and 424 with the insulating layer 431 provided therebetween, and is electrically connected to the conductive layer 424 through an opening formed in the insulating layer 431. The conductive layer 442 functions as the fourth electrode of the capacitor 102 shown in FIG. 1A.

The conductive layer 443 is provided over the semiconductor layer 412 and the conductive layers 424 and 425 with the insulating layer 431 provided therebetween, and is electrically connected to the conductive layer 425 through an opening formed in the insulating layer 431. The conductive layer 443 functions as a scan signal line through which a scan signal SCN12 is input and as the gate of the transistor 103 shown in FIG. 1A.

The planarization insulating layer 451 is provided over the insulating layer 431 with the conductive layers 441 to 443 provided therebetween.

The conductive layer 461 is provided over the planarization insulating layer 451, and is electrically connected to the conductive layer 423 through an opening formed in the insulating layer 431 and the planarization insulating layer 451. The conductive layer 461 functions as the first electrode of the liquid crystal element 104 shown in FIG. 1A.

Further, in the active matrix substrate shown in FIGS. 4A to 4C, all of the conductive layers 425 and 443 are spaced from the conductive layer 421 when seen in a planar view thereof; that is, the conductive layers 425 and 443 do not overlap with the conductive layer 421. Further, in the active matrix substrate shown in FIGS. 4A to 4C, all of the conductive layers 424 and 442 are spaced from the conductive layer 421 when seen in the planar view; that is, the conductive layers 424 and 442 do not overlap with the conductive layer 421.

As the substrate 401, any of the substrates applicable to the substrates 201 and 301 can be used.

As any of the semiconductor layers 411 and 412, any of the semiconductor layers applicable to the semiconductor layers 231 and 232 can be used.

As any of the conductive layers 421 to 425, any of the conductive layers applicable to the conductive layers 241 to 245 can be used.

As any of the conductive layers 441 to 443, any of the conductive layers applicable to the conductive layers 211 to 213 can be used.

As the planarization insulating layer 451, the layer applicable to the planarization insulating layer 271 can be used.

As the conductive layer 461, a layer of any of the conductive materials applicable to the conductive layers 281 and 311 can be used.

As described using FIGS. 4A to 4C, according to the structural example of the active matrix substrate in the display device of the above-described embodiment, the first and second transistors are top-gate transistors and the image signal line through which the image signal IMG is input (e.g., the conductive layer 421 shown in FIGS. 4A to 4C) and the scan signal line through which the scan signal SCN12 is input (e.g., the conductive layer 443 or the conductive layers 424 and 443 shown in FIGS. 4A to 4C) are spaced from each other (spaced from and juxtaposed to each other) when seen in a planar view of the pixel. With this structure, there is no overlap between the first conductive layer and the second conductive layer, so that the parasitic capacitance of the image signal line can be decreased. Accordingly, a delay of an image signal can be decreased, whereby the operation speed of the display device can be improved.

Embodiment 4

In Embodiment 4, a field-sequential display device which is different from the above-described embodiment will be described.

The display device of this embodiment has a pixel. Light of a color which is different per sub-frame period in one frame period enters the pixel.

Figure 5A:
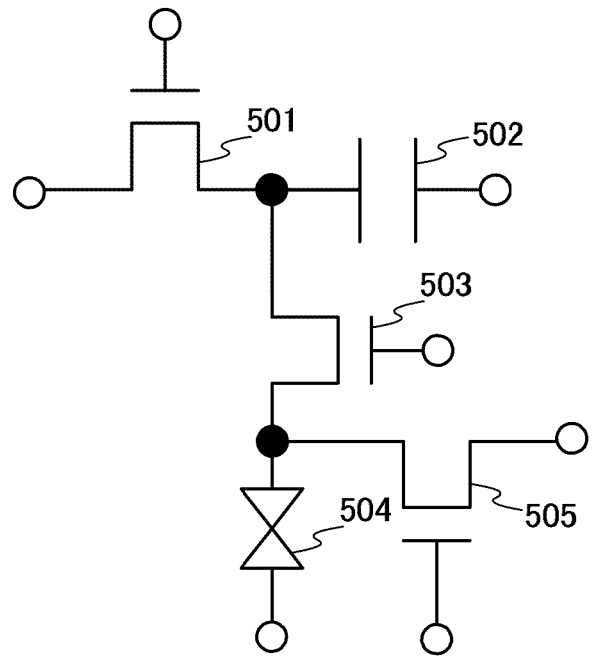
FIGS. 5A and 5B are diagrams illustrating a pixel of a display device in Embodiment 4.
Figure 5B:
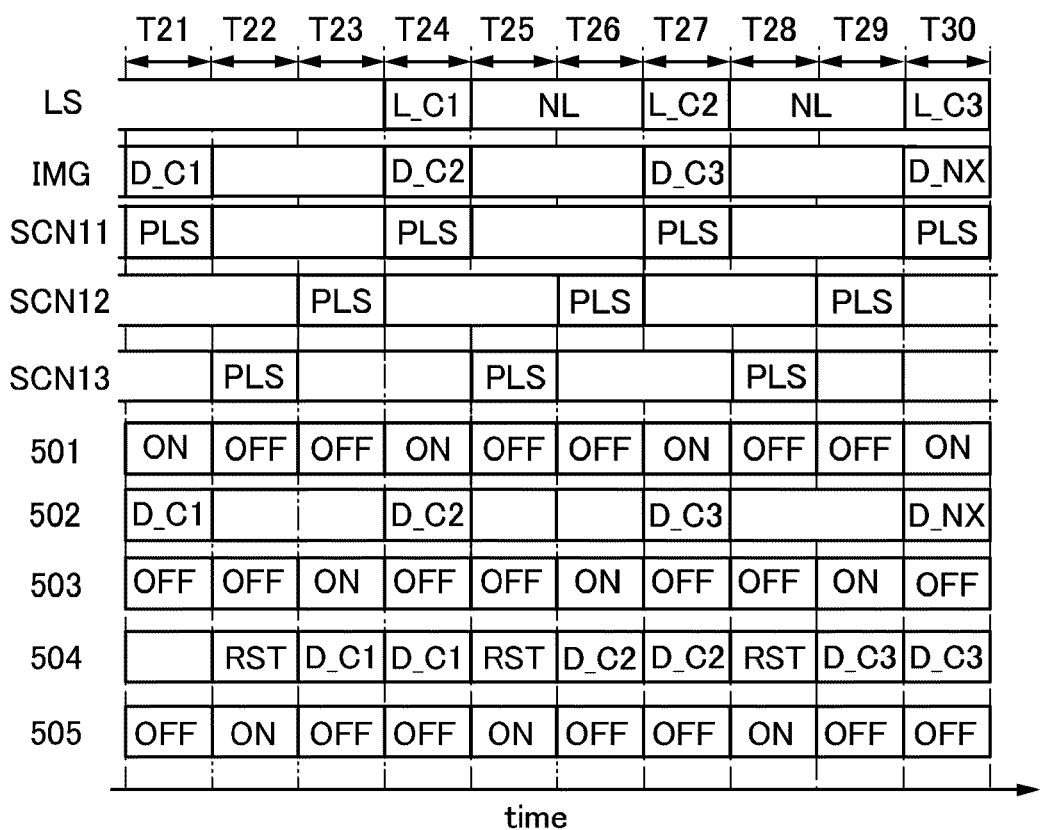

Further, an example of a circuit configuration of the pixel in the display device of this embodiment is described using FIGS. 5A and 5B. FIGS. 5A and 5B illustrate the pixel in the display device of this embodiment.

First, the example of the circuit configuration of the pixel in the display device of this embodiment is described using FIG. 5A.

A pixel shown in FIG. 5A includes a transistor 501, a capacitor 502, a transistor 503, a liquid crystal element 504, and a transistor 505.

Image signal IMG is input to one of a source and a drain of the transistor 501, and a scan signal SCN11 is input to a gate of the transistor 501.

The capacitor 502 has two electrodes. One electrode of the two electrodes of the capacitor 502 is electrically connected to the other of the source and the drain of the transistor 501, and a voltage Va is input to the other electrode of the capacitor 502. The capacitor 502 functions as a storage capacitor for temporarily holding an electric charge in accordance with the image signal IMG. The capacity of the capacitor 502 can be determined in accordance with the capacity of the liquid crystal element 504.

One of a source and a drain of the transistor 503 is electrically connected to the other of the source and the drain of the transistor 501. Scan signal SCN12 is input to a gate of the transistor 503.

The liquid crystal element 504 has a first electrode and a second electrode. The first electrode of the liquid crystal element 504 is electrically connected to the other of the source and the drain of the transistor 503, and a voltage Vb is input to the second electrode of the liquid crystal element 504.

Voltage Vc is input to one of a source and a drain of the transistor 505, the other of the source and the drain of the transistor 505 is electrically connected to the first electrode of the liquid crystal element 504, and a scan signal SCN13 is input to a gate of the transistor 505. The transistor 505 functions as a reset transistor for resetting the voltage of the liquid crystal element 504. The voltage Vc is a predetermined voltage and is also referred to as a reset voltage.

As any of the transistors 501, 503, and 505, like the transistors in the pixel described in Embodiment 1, a transistor including a semiconductor layer using a semiconductor (e.g., silicon) belonging to Group 14 in the periodic table or an oxide semiconductor layer can be used. The semiconductor layer or the oxide semiconductor layer functions as a channel formation layer of the transistor. The semiconductor layer or the oxide semiconductor layer is highly purified to be an intrinsic (also called an I-type) or substantially intrinsic semiconductor layer.

Further, the pixel has an image signal line through which the image signal IMG is input, a scan signal line through which the scan signal SCN12 is input, and a scan signal line through which the scan signal SCN13 is input. The image signal line and the scan signal line through which the scan signal SCN12 is input are spaced from each other when seen in a planar view of the pixel. That is, the image signal line and the scan signal line through which the scan signal SCN12 is input are conductive layers provided over one layer having an insulating surface, and are spaced from and juxtaposed to each other when seen in the planar view of the pixel. For example, the image signal line and the scan signal line through which the scan signal SCN12 is input may be juxtaposed in parallel or substantially parallel to each other with a space provided therebetween when seen in the planar view of the pixel. The image signal line and the scan signal line through which the scan signal SCN13 is input are spaced from each other when seen in the planar view of the pixel. That is, the image signal line and the scan signal line through which the scan signal SCN13 is input are conductive layers provided over one layer having an insulating surface, and are spaced from and juxtaposed to each other when seen in the planar view of the pixel. For example, the image signal line and the scan signal line through which the scan signal SCN13 is input may be juxtaposed in parallel or substantially parallel to each other with a space provided therebetween when seen in the planar view of the pixel.

Further, in the pixel of the display device of this embodiment, the conductive layer functioning as the image signal line may function as one of the source and the drain of the transistor 501. In the pixel of the display device of this embodiment, the conductive layer functioning as the image signal line may be electrically connected to another conductive layer functioning as an image signal line and as one of the source and the drain of the transistor 501.

In the pixel of the display device of this embodiment, the conductive layer functioning as the scan signal line through which the scan signal SCN12 is input may function as the gate of the transistor 503. In the pixel of the display device of this embodiment, the conductive layer functioning as the scan signal line through which the scan signal SCN12 is input may be electrically connected to a conductive layer functioning as another scan signal line through which the scan signal SCN12 is input and as the gate of the transistor 503.

In the pixel of the display device of this embodiment, the conductive layer functioning as the scan signal line through which the scan signal SCN13 is input may function as the gate of the transistor 505. In the pixel of the display device of this embodiment, the conductive layer functioning as the scan signal line through which the scan signal SCN13 is input may be electrically connected to a conductive layer functioning as another scan signal line through which the scan signal SCN13 is input and as the gate of the transistor 505.

Further, the pixel of the display device of this embodiment may be provided with a storage capacitor which is electrically connected to the liquid crystal element 504 in parallel.

Next, as an example of a method for driving the pixel of the display device of this embodiment, an example of a method for driving the pixel shown in FIG. 5A is described using FIG. 5B. Description here is made on the operation in one frame period as one example.

As shown in FIG. 5B, in a period T21, a pulse of the scan signal SCN11 is input to the gate of the transistor 501.

Consequently, the transistor 501 is turned on, and the image signal IMG corresponding to image data D_C1 of a first color C1 is input to the third electrode of the capacitor 502, so that a voltage on the basis of the image data D_C1 is applied to the capacitor 502. The transistors 503 and 505 are in an off state.

Next, in a period T22, a pulse of the scan signal SCN13 is input to the gate of the transistor 505.

Consequently, the transistor 505 is turned on, so that the voltage of the first electrode of the liquid crystal element 504 is reset. Further, the transistor 501 is turned off, and the transistor 503 remains to be off.

Next, in a period T23, a pulse of the scan signal SCN12 is input to the gate of the transistor 503.

Consequently, the transistor 503 is turned on, and the transistors 501 and 505 are turned off. Consequently, an electric charge accumulated in the third electrode of the capacitor 502 moves to the first electrode of the liquid crystal element 504, so that a voltage on the basis of the image data D_C1 is applied to the liquid crystal element 504.

Next, in a period T24, the transistor 503 is turned off, and the liquid crystal element 504 transmits the light of the first color C1 at a transmittance on the basis of the image data D_C1, thereby setting a display state of the pixel.

Further, in the period T24, the pulse of the scan signal SCN11 is input to the gate of the transistor 501. Consequently, the transistor 501 is turned on, and the image signal IMG corresponding to image data D_C2 of a second color C2 is input to the third electrode of the capacitor 502, so that a voltage on the basis of the image data D_C2 is applied to the capacitor 502. The transistors 503 and 505 remain to be off.

Next, in a period T25, the light is stopped entering the liquid crystal element 504, and the pulse of the scan signal SCN13 is input to the gate of the transistor 505.

Consequently, the transistor 505 is turned on, so that the voltage of the first electrode of the liquid crystal element 504 is reset. Further, the transistor 501 is turned off, and the transistor 503 remains to be off.

Next, in a period T26, the pulse of the scan signal SCN12 is input to the gate of the transistor 503.

Consequently, the transistor 503 is turned on, and the transistor 505 is turned off. The transistor 501 remains to be off. Consequently, an electric charge accumulated in the third electrode of the capacitor 502 moves to the first electrode of the liquid crystal element 504, so that a voltage on the basis of the image data D_C2 is applied to the liquid crystal element 504. Entrance of light into the liquid crystal element 504 remains stopping.

Next, in a period 27, the transistor 503 is turned off, the light of the second color C2 enters the liquid crystal element 504, and the liquid crystal element 504 transmits the light of the second color C2 at a transmittance on the basis of the image data D_C2, thereby setting a display state of the pixel. The transistor 505 remains to be off.

Further, in the period T27, the pulse of the scan signal SCN11 is input to the gate of the transistor 501.

Consequently, the transistor 501 is turned on, and an image signal IMG corresponding to image data D_C3 of a third color C3 is input to the third electrode of the capacitor 502, so that a voltage on the basis of the image data D_C3 is applied to the capacitor 502.

Next, in a period T28, the light is stopped entering the liquid crystal element 504, and the pulse of the scan signal SCN13 is input to the gate of the transistor 505.

Consequently, the transistor 505 is turned on, so that the voltage of the first electrode of the liquid crystal element 504 is reset. Further, the transistor 501 is turned off, and the transistor 503 remains to be off.

Next, in a period T29, the pulse of the scan signal SCN12 is input to the gate of the transistor 503.

Consequently, the transistor 503 is turned on. Consequently, an electric charge accumulated in the third electrode of the capacitor 502 moves to the first electrode of the liquid crystal element 504, so that a voltage on the basis of the image data D_C3 is applied to the liquid crystal element 504. The transistor 501 remains to be off, and the transistor 505 is turned off.

Next, in a period 30, the transistor 503 is turned off, the light of the third color C3 enters the liquid crystal element 504, and the liquid crystal element 504 transmits the light of the third color C3 at a transmittance on the basis of the image data D_C3, thereby setting a display state of the pixel. The transistor 505 remains to be off.

Further, in the period T30, the pulse of the scan signal SCN11 is input to the gate of the transistor 501.

Consequently, the transistor 501 is turned on, and the image signal IMG corresponding to image data D_NX of the next color is input to the third electrode of the capacitor 502, so that a voltage on the basis of the image data D_NX is applied to the capacitor 502. In this manner, a full-color image is displayed in one frame period. The above is an example of the method for driving the pixel shown in FIG. 5A.

Further, in the case where the display device of this embodiment is provided with a plurality of pixels arranged in matrix, it is preferable that the writing operation of image data into the capacitor 502 in each pixel (the operation in each of the period T21, the period T24, the period T27, and the period T30 in FIG. 5B) be performed per row, and the reset operation of the voltage applied to the liquid crystal element 504 in each pixel (the operation in each of the period T22, the period T25, and the period T28 in FIG. 5B) and the moving operation of an electric charge into the liquid crystal element 504 in each pixel (the operation in each of the period T23, the period T26, and the period T29 in FIG. 5B) be performed all at once. Accordingly, the period of time for the moving operation of electric charge into the liquid crystal element 504 in each pixel can be decreased.

As described using FIGS. 5A and 5B, the display device of this embodiment is provided with the pixel which includes the first transistor, the second transistor, the liquid crystal element, the capacitor for temporarily holding data of the image signal IMG, and the third transistor for resetting the voltage applied to the liquid crystal element, in which the first transistor is turned on to apply the data voltage of the image signal IMG to the capacitor, the third transistor is turned on to rest the voltage applied to the liquid crystal element to a predetermined value, and the second transistor is turned on to move the electric charge accumulated in the capacitor into the liquid crystal element, so that the data voltage of the image signal IMG is applied to the liquid crystal element. According to this structure, during a period in which a display is performed by the pixel, the next image data can be written into the pixel. Accordingly, the period of time for displaying one image can be reduced without shortening the display period, whereby the operation speed of the display device can be increased.

Further, the third transistor for resetting the voltage applied to the liquid crystal element enables the limitations on setting the voltage of the image signal IMG to be reduced. For example, in the case where the voltage applied to the liquid crystal element is not reset, the voltage applied to the liquid crystal element is determined in accordance with not only an electric charge held in the capacitor but also a voltage held in the liquid crystal element; that is, in order to apply an appropriate data voltage to the liquid crystal element, it is necessary to set the voltage of the image signal IMG, considering a data voltage applied in the previous period. For example, in order to apply 5 V to the liquid crystal element, it is necessary to control the voltage of the image signal IMG differently depending on whether the voltage applied to the liquid crystal element in the previous period is 0 V or 10 V. On the other hand, in the case where the voltage applied to the liquid crystal element is reset, the voltage applied to the liquid crystal element can be set regardless of the data voltage applied in the previous period. Therefore, the limitations on setting the voltage of the image signal IMG can be reduced.

Embodiment 5

In Embodiment 5, an example of a structure of the pixel in the display device described in Embodiment 4 will be described.

The pixel in the display device described in Embodiment 4 includes an active matrix substrate, a counter substrate, and a liquid crystal layer provided between the active matrix substrate and the counter substrate.

Figure 6A:
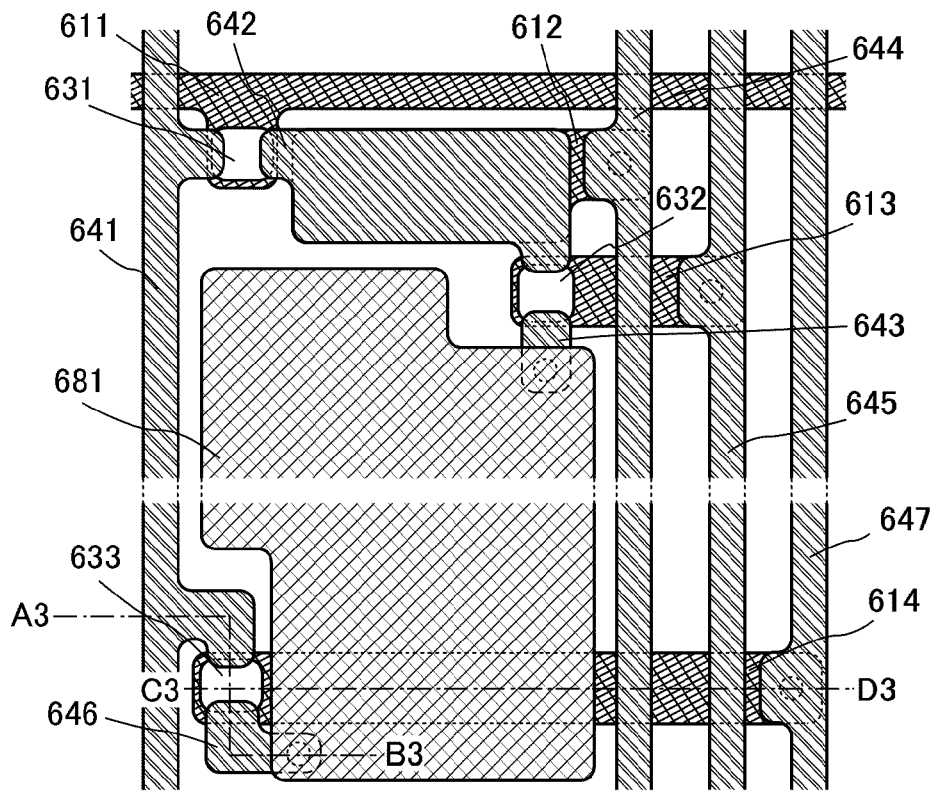
FIGS. 6A to 6C are schematic diagrams illustrating a structural example of an active-matrix substrate in the display device in Embodiment 4.
Figure 6B:
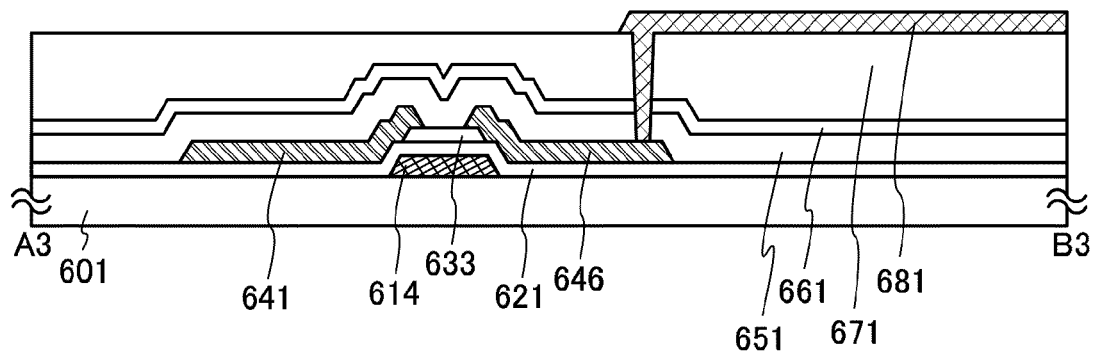
Figure 6C:
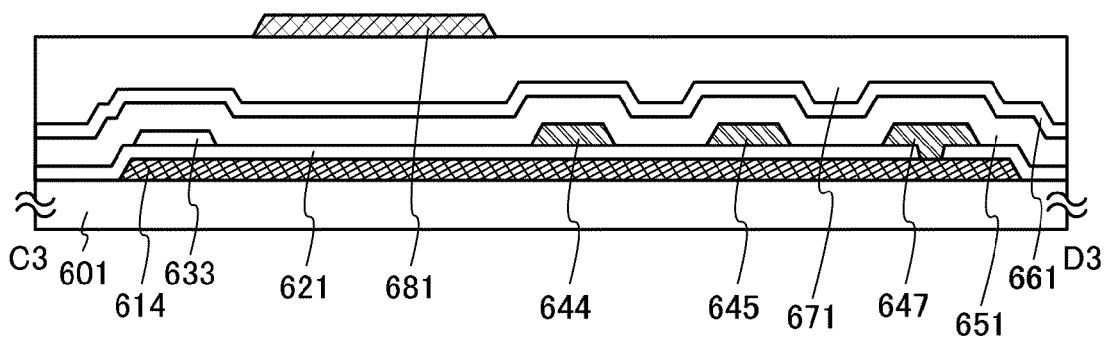

Further, a structural example of the active matrix substrate in the display device described in Embodiment 4 is described using FIGS. 6A to 6C. FIGS. 6A to 6C are schematic diagrams illustrating the structural example of the active matrix substrate in the display device described in Embodiment 4: FIG. 6A is a plan schematic diagram; FIG. 6B is a cross-sectional schematic diagram along line A3-B3 in FIG. 6A; and FIG. 6C is a cross-sectional schematic diagram along line C3-D3 in FIG. 6A.

The active matrix substrate shown in FIGS. 6A to 6C has conductive layers 611, 612, 613, and 614, an insulating layer 621, semiconductor layers 631, 632, and 633, conductive layers 641, 642, 643, 644, 645, 646, and 647, an oxide insulating layer 651, a protective insulating layer 661, a planarization insulating layer 671, and a conductive layer 681.

The conductive layers 611 to 614 are provided for one surface of the substrate 601. The conductive layer 611 functions as the scan signal line through which the scan signal SCN11 is input and functions as the gate of the transistor 501 shown in FIG. 5A. The conductive layer 612 functions as the fourth electrode of the capacitor 502 shown in FIG. 5A and functions as the wiring through which the voltage Va is input. The conductive layer 613 functions as the scan signal line through which the scan signal SCN12 is input and functions as the gate of the transistor 503 shown in FIG. 5A. The conductive layer 614 functions as the scan signal line through which the scan signal SCN13 is input and functions as the gate of the transistor 505 shown in FIG. 5A.

The insulating layer 621 is provided for one surface of the substrate 601 with the conductive layers 611 to 614 provided therebetween. The insulating layer 621 functions as a gate insulating layer of the transistor 501 shown in FIG. 5A, as a dielectric layer of the capacitor 502 shown in FIG. 5A, as a gate insulating layer of the transistor 503 shown in FIG. 5A, and as a gate insulating layer of the transistor 505 shown in FIG. 5A.

The semiconductor layer 631 is provided over the conductive layer 611 with the insulating layer 621 provided therebetween. The semiconductor layer 631 functions as the channel formation layer of the transistor 501 shown in FIG. 5A.

The semiconductor layer 632 is provided over the conductive layer 613 with the insulating layer 621 provided therebetween. The semiconductor layer 632 functions as a channel formation layer of the transistor 503 shown in FIG. 5A.

The semiconductor layer 633 is provided over the conductive layer 614 with the insulating layer 621 provided therebetween. The semiconductor layer 633 functions as a channel formation layer of the transistor 505 shown in FIG. 5A.

The conductive layer 641 is electrically connected to the semiconductor layer 631. The conductive layer 641 functions as the image signal line through which the image signal IMG is input and as one of the source and the drain of the transistor 501 shown in FIG. 5A. Further, as shown in FIGS. 6A to 6C, in the display device of this embodiment, the conductive layer 641 can be electrically connected to the semiconductor layer 633, and can function as the wiring through which the reset voltage (voltage Vc) is input and as one of the source and the drain of the transistor 505 shown in FIG. 5A.

The conductive layer 642 is electrically connected to the semiconductor layers 631 and 632. The conductive layer 642 is provided over the conductive layer 612 with the insulating layer 621 provided therebetween. The conductive layer 642 functions as the other of the source and the drain of the transistor 501 shown in FIG. 5A, as the third electrode of the capacitor 502 show in FIG. 5A, and as one of the source and the drain of the transistor 503 shown in FIG. 5A.

The conductive layer 643 is electrically connected to the semiconductor layer 632. The conductive layer 643 functions as the other of the source and the drain of the transistor 503 shown in FIG. 5A.

The conductive layer 644 is provided over the conductive layer 612 with the insulating layer 621 provided therebetween, and is electrically connected to the conductive layer 612 through an opening formed in the insulating layer 621. The conductive layer 644 functions as the wiring through which the voltage Va is input.

The conductive layer 645 is provided over the conductive layer 613 with the insulating layer 621 provided therebetween, and is electrically connected to the conductive layer 613 through an opening formed in the insulating layer 621. The conductive layer 645 functions as the scan signal line through which the scan signal SCN12 is input.

The conductive layer 646 is electrically connected to the semiconductor layer 633. The conductive layer 646 functions as the other of the source and the drain of the transistor 505 shown in FIG. 5A.

The conductive layer 647 is provided over the conductive layer 614 with the insulating layer 621 provided therebetween, and is electrically connected to the conductive layer 614 through an opening formed in the insulating layer 621.

The oxide insulating layer 651 is provided over the insulating layer 621 with the semiconductor layers 631 to 633 and the conductive layers 641 to 647 provided therebetween.

The protective insulating layer 661 is provided over the oxide insulating layer 651.

The planarization insulating layer 671 is provided over the protective insulating layer 661.

The conductive layer 681 is provided over the planarization insulating layer 671, and is electrically connected to the conductive layer 643 through a first opening formed in the oxide insulating layer 651, the protective insulating layer 661, and the planarization insulating layer 671 and is electrically connected to the conductive layer 646 through a second opening formed in the oxide insulating layer 651, the protective insulating layer 661, and the planarization insulating layer 671. The conductive layer 681 functions as the first electrode of the liquid crystal element 504 shown in FIG. 5A.

Further, in the active matrix substrate shown in FIGS. 6A to 6C, all of the conductive layers 613 and 645 are spaced from the conductive layer 641 when seen in a planar view; that is, the conductive layers 613 and 645 are spaced from and juxtaposed to the conductive layer 641, or the conductive layers 613 and 645 do not overlap with the conductive layer 641. In the active matrix substrate shown in FIGS. 6A to 6C, all of the conductive layers 614 and 647 are spaced from the conductive layer 641 when seen in the planar view; that is, the conductive layers 614 and 647 are spaced from and juxtaposed to the conductive layer 641, or the conductive layers 614 and 647 do not overlap with the conductive layer 641. In the active matrix substrate shown in FIGS. 6A to 6C, all of the conductive layers 612 and 644 are spaced from the conductive layer 641 when seen in the planar view; that is, the conductive layers 612 and 644 are spaced from and juxtaposed to the conductive layer 641, or the conductive layers 612 and 644 do not overlap with the conductive layer 641.

Figure 7:
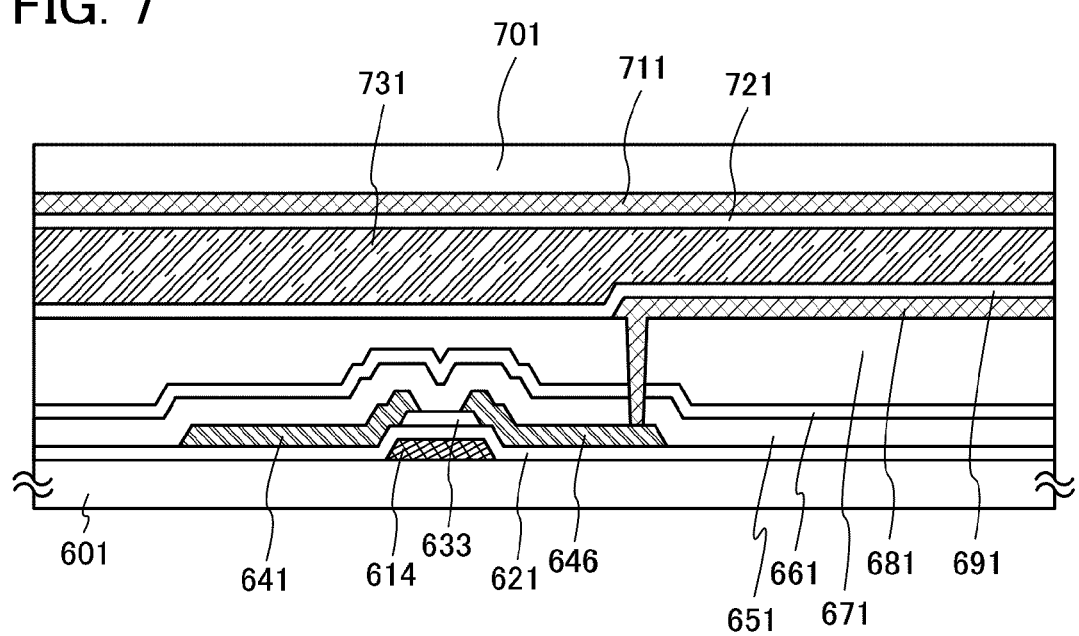
FIG. 7 is a cross-sectional schematic diagram illustrating a structural example of a pixel in Embodiment 5.

Further, a structural example of the pixel in the display device of this embodiment is described using FIG. 7. FIG. 7 is a cross-sectional schematic diagram illustrating the structural example of the pixel in the display device of this embodiment.

The display device shown in FIG. 7 has the active matrix substrate shown in FIGS. 6A to 6C, a substrate 701, a conductive layer 711, an insulating layer 721, and a liquid crystal layer 731.

The display device shown in FIG. 7 has an insulating layer 691 over the planarization insulating layer 671 with the conductive layer 681 provided therebetween.

The conductive layer 711 is provided for one surface of the substrate 701.

The insulating layer 721 is provided for one surface of the conductive layer 711.

The liquid crystal layer 731 is provided between the conductive layer 681 and the conductive layer 711 with the insulating layer 691 and the insulating layer 721 provided therebetween.

The liquid crystal element 504 shown in FIG. 5A includes the conductive layer 681, the conductive layer 711, and the liquid crystal layer 731.

As any of the substrates 601 and 701, any of the substrates applicable to the substrates 201 and 301 shown in FIGS. 2A to 2C can be used.

As any of the conductive layers 611 to 614, any of the conductive layers applicable to the conductive layers 211 to 213 shown in FIGS. 2A to 2C can be used.

As the insulating layer 621, the layer applicable to the insulating layer 221 shown in FIGS. 2A to 2C can be used.

As any of the semiconductor layers 631 to 633, any of the semiconductor layers applicable to the semiconductor layers 231 and 232 shown in FIGS. 2A to 2C can be used. As one example, the case where oxide semiconductor layers are used as the semiconductor layers 631 to 633 is illustrated in FIGS. 6A to 6C.

As any of the conductive layers 641 to 647, any of the conductive layers applicable to the conductive layers 241 to 245 shown in FIGS. 2A to 2C can be used.

As the oxide insulating layer 651, the layer applicable to the oxide insulating layer 251 shown in FIGS. 2A to 2C can be used.

As the protective insulating layer 661, the layer applicable to the protective insulating layer 261 shown in FIGS. 2A to 2C can be used.

As the planarization insulating layer 671, the layer applicable to the planarization insulating layer 271 shown in FIGS. 2A to 2C can be used.

As any of the conductive layers 681 and 711, the conductive layer applicable to the conductive layer 281 shown in FIGS. 2A to 2C can be used, for example.

As any of the insulating layers 691 and 721, the layer applicable to the insulating layer 221 shown in FIGS. 2A to 2C can be used.

As the liquid crystal layer 731, a layer of the material applicable to the liquid crystal layer 331 shown in FIG. 3 can be used.

As described using FIGS. 6A to 6C, according to the pixel in the display device of the above-described embodiment, the first to third transistors are bottom-gate transistors and the image signal line through which the image signal IMG is input (e.g., the conductive layer 641 shown in FIGS. 6A to 6C) and the scan signal line through which the scan signal SCN12 is input (e.g., the conductive layer 613 or the conductive layers 613 and 645 shown in FIGS. 6A to 6C) are spaced from each other (spaced from and juxtaposed to each other) when seen in a planar view of the pixel. Further, according to the pixel in the display device of the above-described embodiment, the image signal line through which the image signal IMG is input and the scan signal line through which the scan signal SCN13 is input (e.g., the conductive layer 614 or the conductive layers 614 and 647 shown in FIGS. 6A to 6C) are spaced from each other (spaced from and juxtaposed to each other) when seen in the planar view of the pixel. With this structure, there is no overlap between the image signal line and the scan signal line, so that the parasitic capacitance of the image signal line can be decreased. Accordingly, a delay of an image signal can be decreased, whereby the operation speed of the display device can be improved.

According to the pixel in the display device of the above-described embodiment, the conductive layer functioning as the image signal line and the conductive layer functioning as the wiring through which the reset signal is input are common to each other. With this structure, a voltage input to that conductive layer can be used as the reset voltage in the period during which data input by the image signal IMG is not performed (e.g., the period 22, the period 25, and the period 28 in FIG. 5B), whereby the number of wirings can be reduced.

In the pixel of the display device of this embodiment, the first to third transistors may be top-gate transistors.

Embodiment 6

In Embodiment 6, an example of a method for manufacturing a transistor in the pixel of the display device of the above-described embodiment will be described.

As the example of the method for manufacturing the transistor in this embodiment, a method for manufacturing the transistor shown in FIGS. 2A to 2C (the transistor 101 show in FIG. 1A) will be described using FIGS. 8A to 8C and 9A and 9B. FIGS. 8A to 8C and 9A and 9B are cross-sectional schematic diagrams illustrating the method for manufacturing the transistor shown in FIGS. 2A to 2C.

First, the substrate 201 is prepared, and a first conductive film is formed over the substrate 201.

A glass substrate is used as an example of the substrate 201.

As the first conductive film, a film of a metal material such as molybdenum, titanium, chromium, tantalum, tungsten, aluminum, copper, neodymium, or scandium, or an alloy material which contains any of the metal materials as a main component can be used. A stack of layers of materials applicable to the first conductive film can be used to form the first conducive film.

Next, a first photolithography process is carried out to form a first resist mask over the first conductive film, the first conductive film is selectively etched with use of the first resist mask to form the conductive layer 211, and the first resist mask is removed.

In this embodiment, the resist mask may be formed by an ink-jet method. Formation of the resist mask by an inkjet method needs no photomask; thus, manufacturing cost can be reduced.

In order to reduce the number of photomasks and steps in the photolithography process, etching may be performed using a resist mask formed with a multi-tone mask. The multi-tone mask is a mask through which light is transmitted to have a plurality of intensities. The resist mask formed with the use of the multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed with one multi-tone mask.

This makes it possible to reduce the number of photomasks and omit the number of corresponding photolithography steps, thereby simplifying the manufacturing process.

Next, the insulating layer 221 is formed over the conductive layer 211.

For example, the insulating layer 221 can be formed by a high-density plasma enhanced CVD method. For example, a high-density plasma enhanced CVD method using microwaves (e.g., microwaves with a frequency of 2.45 GHz) is preferable as the method for forming the insulating layer 221 because an insulating layer can be dense and have high withstand voltage and high quality. The high-quality insulating layer formed by such a high-density plasma enhanced CVD method is in contact with an oxide semiconductor layer, whereby the interface state therebetween can be reduced and high interface characteristics can be obtained.

The insulating layer 221 can also be formed by another method such as a sputtering method or a plasma CVD method. Further, heat treatment may be performed after the formation of the insulating layer 221. The heat treatment performed after the formation of the insulating layer 221 can improve the quality of the insulating layer 221 and the interface characteristics between the insulating layer 221 and the oxide semiconductor.

Next, an oxide semiconductor film 230 having a thickness greater than or equal to 2 nm and less than or equal to 200 nm, preferably greater than or equal to 5 nm and less than or equal to 30 nm is formed over the insulating layer 221. For example, the oxide semiconductor film 230 can be formed by a sputtering method.

Before the formation of the oxide semiconductor film 230, it is preferable to perform reverse sputtering in which an argon gas is introduced and plasma is generated so that powdery substances (also referred to as particles or dust) attached on a surface of the insulating layer 221 are removed. The reverse sputtering refers to a method in which, without application of voltage to a target side, an RF power source is used for application of voltage to a substrate side in an argon atmosphere, so that plasma is generated to modify a surface of the substrate. Instead of an argon atmosphere, a nitrogen atmosphere, a helium atmosphere, an oxygen atmosphere, or the like may be used.

For example, the oxide semiconductor film 230 can be formed using an oxide semiconductor material which can be used as a material of the oxide semiconductor layer 231. In this embodiment, as an example, the oxide semiconductor film 230 is formed by a sputtering method with the use of an In—Ga—Zn—O-based oxide target. A cross-sectional schematic diagram at this stage is FIG. 8A. Further, the oxide semiconductor film 230 can be formed by a sputtering method in a rare gas (typically, argon) atmosphere, an oxygen atmosphere, or a mixed atmosphere of a rare gas and oxygen.

As a target for forming the oxide semiconductor film 230 by a sputtering method, for example, an oxide target having a composition ratio of $In_2O_3:Ga_2O_3:ZnO=1:1:1$ [molar ratio] can be used. Without limitation to the above target, an oxide target having a composition ratio of $In_2O_3:Ga_2O_3:ZnO=1:1:2$ [molar ratio] may be used, for example. The proportion of the volume of a portion except for an area occupied by a space and the like with respect to the total volume of the oxide target (also referred to as the filling rate) is greater than or equal to 90% and less than or equal to 100%, preferably greater than or equal to 95% and less than or equal to 99.9%. A metal oxide target with high filling rate provides the oxide semiconductor film with high density.

As a sputtering gas used for forming the oxide semiconductor film 230, for example, a high-purity gas from which an impurity such as hydrogen, water, hydroxyl groups, or hydride is removed is preferably used.

Before the formation of the oxide semiconductor film 230, it is preferable that the substrate 201 over which the conductive layer 211 is formed or the substrate 201 over which the conductive layer 211 and the insulating layer 221 are formed be heated in a preheating chamber of a sputtering apparatus, so that an impurity such as hydrogen or moisture adsorbed on the substrate 201 is eliminated and exhausted. The heating in the preheating chamber can prevent hydrogen, hydroxyl groups, and moisture from entering the insulating layer 221 and the oxide semiconductor film 230. It is preferable that an evacuation means such as a cryopump be provided for the preheating chamber. The heating in the preheating chamber may be omitted. Before the oxide insulating layer 251 is formed, the substrate 201 subjected to the manufacturing process up to and including the step for forming the conductive layers 241 and 242 may be subjected to heating in the preheating chamber in a similar manner to the above as well.

When the oxide semiconductor film 230 is formed by a sputtering method, the substrate 201 is held inside a film deposition chamber which is kept in a reduced pressure state, and the temperature of the substrate 201 is set to be higher than or equal to 100° C. and lower than or equal to 600° C., preferably higher than or equal to 200° C. and lower than or equal to 400° C. By increasing the temperature of the substrate 201, the concentration of an impurity contained in the oxide semiconductor film 230 can be reduced. Further, damage on the oxide semiconductor film 230 due to sputtering can be reduced. Then, a sputtering gas from which hydrogen and moisture are removed is introduced while remaining moisture in the film deposition chamber is removed, so that the oxide semiconductor film 230 is formed over the insulating layer 221 with the use of the above-described target.

In this embodiment, for example, an entrapment vacuum pump can be used as a means for removing moisture remained in the film deposition chamber in which sputtering is performed. As the entrapment vacuum pump, a cryopump, an ion pump, or a titanium sublimation pump can be used, for example. When a cryopump is used as an example, a compound including either or both of a hydrogen atom and a carbon atom, or the like can be exhausted, and thus the concentration of an impurity included in the film formed in the film deposition chamber can be reduced. Further, in this embodiment, a turbo pump provided with a cold trap may also be used as a means for removing moisture remained in the film deposition chamber in which sputtering is performed.

One example of the deposition condition is as follows: the distance between the substrate and the target is 100 mm, the pressure is 0.6 Pa, the direct-current (DC) power is 0.5 kW, and the atmosphere is an oxygen atmosphere (the proportion of the oxygen flow rate is 100%). The pulse direct-current power supply makes it possible to reduce powdery substances that occur at the time of film deposition and to make the film thickness uniform.

Next, a second photolithography process is carried out to form a second resist mask over the oxide semiconductor film 230, the oxide semiconductor film 230 is selectively etched with use of the second resist mask to process the oxide semiconductor film 230 into an island-shaped oxide semiconductor layer, and the second resist mask is removed.

In the case of forming a contact hole in the insulating layer 221, the contact hole can be formed at the time of processing the oxide semiconductor film 230 into the island-shaped oxide semiconductor layer.

For example, dry etching, wet etching, or both dry etching and wet etching can be employed for etching the oxide semiconductor film 230. As an etchant used for wet etching, for example, a mixed solution of phosphoric acid, acetic acid, and nitric acid, or the like can be used. As another example of the etchant, ITO07N (produced by KANTO CHEMICAL CO., INC.) may be used.

Next, the oxide semiconductor layer is subjected to heat treatment. Through the heat treatment, the oxide semiconductor layer can be dehydrated or dehydrogenated. The temperature of the heat treatment is higher than or equal to 400° C. and lower than or equal to 750° C., or higher than or equal to 400° C. and lower than the strain point of the substrate. In this embodiment, the substrate is put in an electric furnace that is a kind of heat treatment apparatus and heat treatment is performed on the island-shaped oxide semiconductor layer in a nitrogen atmosphere at 450° C. for one hour, and then the oxide semiconductor layer is not exposed to the air so that entry of water and hydrogen into the island-shaped oxide semiconductor layer is prevented. In this manner, the oxide semiconductor layer 231 is obtained (see FIG. 8B).

The heat treatment apparatus is not limited to an electric furnace and may be an apparatus for heating an object by heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used as the heat treatment apparatus. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. The GRTA apparatus is an apparatus for heat treatment using a high-temperature gas. As the high-temperature gas, an inert gas which does not react with an object by heat treatment, such as nitrogen or a rare gas like argon, can be used.

For example, as the heat treatment, heat treatment may be performed with the use of a GRTA apparatus as follows: the substrate 201 over which the layers up to and including the island-shaped oxide semiconductor layer are formed is moved into an inert gas whose temperature is 650° C. to 700° C., heated for several minutes, and taken out of the heated inert gas.

Note that in the heat treatment, it is preferable that water, hydrogen, and the like be not contained in nitrogen or a rare gas such as helium, neon, or argon. The purity of nitrogen or a rare gas such as helium, neon, or argon introduced into the heat treatment apparatus is preferably 6N (99.9999%) or more, far preferably 7N (99.99999%) or more; that is, the impurity concentration of nitrogen or a rare gas such as helium, neon, or argon introduced into the heat treatment apparatus is preferably 1 ppm or less, far preferably 0.1 ppm or less.

After the island-shaped oxide semiconductor layer is heated by the heat treatment, a high-purity oxygen gas, a high-purity $N_2O$ gas, or ultra-dry air (having a dew point of −40° C. or less, preferably −60° C. or less) may be introduced into the furnace which is the same as that for the heat treatment. It is preferable that the oxygen gas or the $N_2O$ gas do not contain water, hydrogen, and the like. The purity of the oxygen gas or the $N_2O$ gas which is introduced into the heat treatment apparatus is preferably 6N or more, far preferably 7N or more; that is, the impurity concentration of the oxygen gas or the $N_2O$ gas is preferably 1 ppm or less, far preferably 0.1 ppm or less. The oxygen gas or the $N_2O$ gas acts to supply oxygen that is reduced through the step of eliminating an impurity by the dehydration or dehydrogenation treatment; thus, the oxide semiconductor layer 231 is highly purified.

The heat treatment may be performed as well on the oxide semiconductor film 230 before been processed into the island-shaped oxide semiconductor layer, with the use of the above heat treatment apparatus. In that case, after the heat treatment, the substrate 201 after being subjected to the manufacturing process up to and including the step of forming the oxide semiconductor film 230 is taken out of the heat treatment apparatus and the oxide semiconductor film 230 is processed into the island-shaped oxide semiconductor layer.

The heat treatment can be performed at any timing after the formation of the oxide semiconductor film 230. For example, the heat treatment may be performed after the conductive layers 241 and 242 are formed over the semiconductor layer 231 or after the oxide insulating layer 251 is formed over the conductive layers 241 and 242.

In the case of forming a contact hole in the insulating layer 221, the contact hole may be formed before the heat treatment is performed.

The oxide semiconductor layer may be formed using an oxide semiconductor film which is formed by two deposition steps and two heat treatments so as to be a thick film including a crystalline region (a single crystal region), that is, a crystalline region having a c-axis aligned in a direction perpendicular to a surface of the film, regardless of the material of a base component such as an oxide, a nitride, or a metal. For example, a first oxide semiconductor film with a thickness greater than or equal to 3 nm and less than or equal to 15 nm is deposited and subjected to first heat treatment at a temperature higher than or equal to 450° C. and lower than or equal to 850° C., preferably higher than or equal to 550° C. and lower than or equal to 750° C. under an atmosphere of nitrogen, oxygen, a rare gas, or dry air, so that the first oxide semiconductor film which includes a crystalline region (including a plate-like crystal) in a region including a surface is formed. Then, a second oxide semiconductor film which is thicker than the first oxide semiconductor film is formed. Then, a heat treatment at a temperature higher than or equal to 450° C. and lower than or equal to 850° C., preferably higher than or equal to 600° C. and lower than or equal to 700° C. is performed as a second heat treatment, so that a crystal of the first oxide semiconductor film is used as a seed of crystal growth and grown upward from the first oxide semiconductor film to the second oxide semiconductor film, whereby the whole of the second oxide semiconductor film is crystallized. As a result, the oxide semiconductor film having a crystal region with a large thickness can be used to form the oxide semiconductor layer 231.

Next, a second conductive film is formed over the insulating layer 221 and the semiconductor layer 231.

As the second conductive film, a film of a metal material such as aluminum, chromium, copper, tantalum, titanium, molybdenum, or tungsten, or an alloy material which contains any of the metal materials as a main component can be used, for example. A stack of layers each applicable to the second conductive film can be used to form the second conductive film.

Figure 8A:
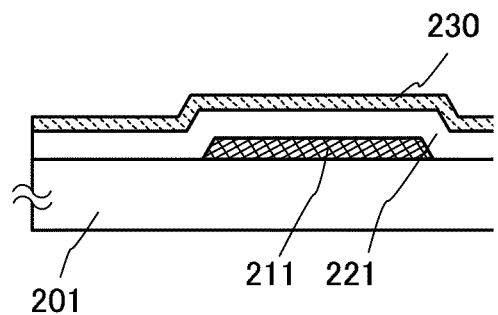
FIGS. 8A to 8C are cross-sectional schematic diagrams illustrating a manufacturing method of a transistor shown in FIGS. 2A to 2C.
Figure 8B:
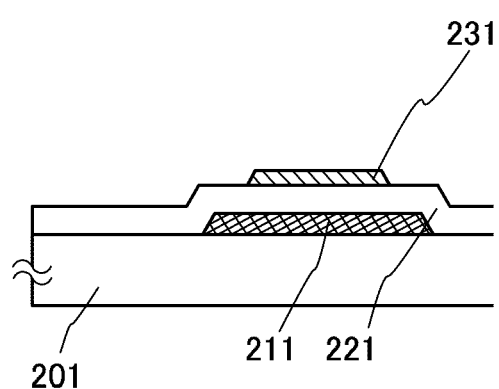
Figure 8C:
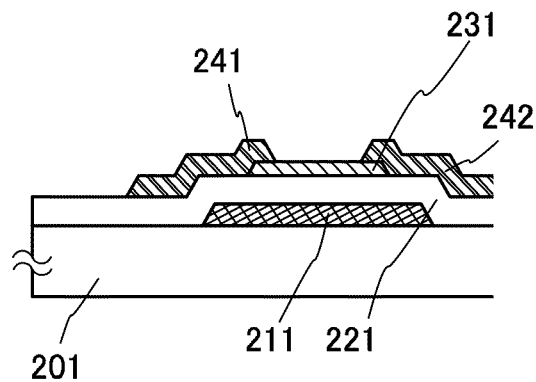

Next, a third photolithography process is carried out to form a third resist mask over the second conductive film, the second conductive film is selectively etched with use of the third resist mask to form the conductive layer 241 and the conductive layer 242, and the third resist mask is removed (see FIG. 8C).

Further, another wiring may also be formed using the second conductive film at the time of forming the conductive layers 241 and 242.

In light exposure in forming the third resist mask, ultraviolet light, KrF laser light, or ArF laser light is preferably used. A channel length L of the transistor depends on the width of an interval between a bottom end of the conductive layer 241 and a bottom end of the conductive layer 242 which are adjacent to each other over the oxide semiconductor layer 231. In the case where the channel length L is less than 25 nm, the light exposure used to form the third resist mask is preferably performed using extreme ultraviolet light having an extremely short wavelength of several nanometers to several tens of nanometers. With the light exposure by extreme ultraviolet light, the resolution is high and the focus depth is large. Therefore, the channel length L of the transistor can made to be greater than or equal to 10 nm and less than or equal to 1000 nm, and usage of such a transistor formed using the light exposure as described above enables higher speed operation of a field-sequential display device.

When the second conductive film is etched, etching conditions are preferably optimized in order to prevent the oxide semiconductor layer 231 from being divided by the etching. However, it is difficult to set the conditions under which only the second conductive film is etched and the oxide semiconductor layer 231 is not etched at all; in some cases, part of the oxide semiconductor layer 231 is etched away at the time of etching of the second conductive film, whereby the oxide semiconductor layer 231 includes a groove portion (depression portion).

In this embodiment, a titanium film is used as an example of the second conductive film, an In—Ga—Zn—O-based oxide semiconductor is used as an example of the oxide semiconductor layer 231, and an ammonia hydrogen peroxide solution (a mixture of ammonia, water, and a hydrogen peroxide solution) is used as an etchant.

Next, the oxide insulating layer 251 is formed over the semiconductor layer 231 and the conductive layers 241 and 242. The oxide insulating layer 251 is formed so as to be in contact with part of the top surface of the semiconductor layer 231.

The oxide insulating layer 251 can be formed to a thickness of at least 1 nm using a method by which an impurity such as water or hydrogen does not enter the oxide insulating layer 251, such as a sputtering method, as appropriate. When hydrogen is contained in the oxide insulating layer 251, entry of the hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. Therefore, in order to form the oxide insulating layer 251 containing as little hydrogen as possible, it is preferable to employ a formation method in which hydrogen is not used.

In this embodiment, as an example of the oxide insulating layer 251, a silicon oxide film having a thickness of 200 nm is formed by a sputtering method. The temperature of the substrate 201 at the time of the film formation may be higher than or equal to room temperature and lower than or equal to 300° C.; in this embodiment, 100° C. as an example. The formation of a silicon oxide film by a sputtering method can be performed in a rare gas (typically, argon) atmosphere, an oxygen atmosphere, or a mixed atmosphere of a rare gas and oxygen.

Further, a silicon oxide target or a silicon target can be used as a target for forming the oxide insulating layer 251. For example, with use of a silicon target, a silicon oxide film can be formed by a sputtering method under an atmosphere containing oxygen.

As a sputtering gas used for forming the oxide semiconductor film 251, for example, a high-purity gas from which an impurity such as hydrogen, water, hydroxyl groups, or hydride is removed is preferably used.

Before formation of the oxide insulating layer 251, plasma treatment with the use of a gas of $N_2O$, $N_2$, Ar, or the like may be performed to remove water or the like adsorbed on an exposed surface of the oxide semiconductor layer 231. In the case where plasma treatment is performed, the oxide insulating layer 251 which is in contact with part of the top surface of the oxide semiconductor layer 231 is preferably formed without exposure to the air.

Further, heat treatment (preferably, at a temperature higher than or equal to 200° C. and lower than or equal to 400° C., for example, at a temperature higher than or equal to 250° C. and less than or equal to 350° C.) can be performed in an inert gas atmosphere or in an oxygen gas atmosphere. For example, as the heat treatment performed in an inert gas atmosphere or an oxygen gas atmosphere, heat treatment is performed in a nitrogen atmosphere at 250° C. for one hour. Through the heat treatment in an inert gas atmosphere or an oxygen gas atmosphere, heat is applied while part of the top surface of the oxide semiconductor layer 251 is in contact with the oxide insulating layer 231.

Through the above-described process, an impurity such as hydrogen, moisture, hydroxyl groups, or hydride (also referred to as a hydrogen compound) can be removed from the oxide semiconductor layer, and in addition, oxygen can be supplied to the oxide semiconductor layer. Accordingly, the oxide semiconductor layer is highly purified.

Figure 9A:
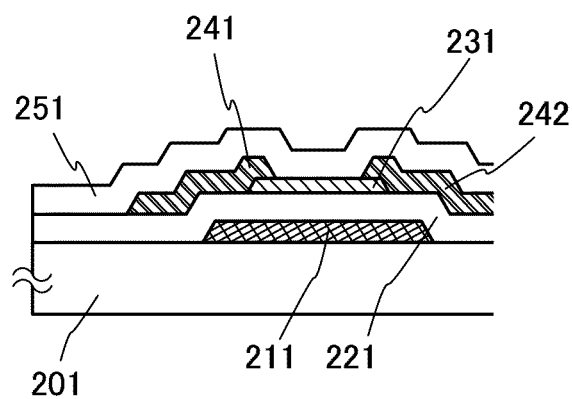
FIGS. 9A and 9B are cross-sectional schematic diagrams illustrating a manufacturing method of the transistor shown in FIGS. 2A to 2C.
Figure 9B:
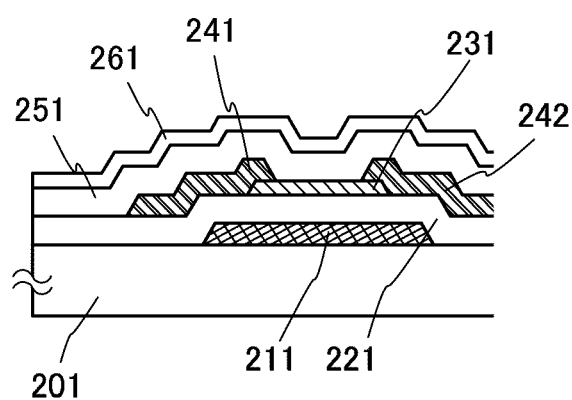

Through the above-described process, the transistor can be formed (see FIG. 9A).

In the case where a silicon oxide layer having many defects is used as the oxide insulating layer 251, the heat treatment after formation of the silicon oxide layer has an effect of diffusing an impurity such as hydrogen, moisture, hydroxyl groups, or hydride contained in the oxide semiconductor layer 231 to the oxide insulating layer 251, so that the amount of impurity contained in the oxide semiconductor layer 231 can be further reduced.

The protective insulating layer 261 may be further formed over the oxide insulating layer 251. As the protective insulating layer 261, a silicon nitride film can be formed by an RF sputtering method, for example. Since the RF sputtering method features high productivity, it is preferably used as a deposition method of an insulating film to form the protective insulating layer 261. In this embodiment, as the protective insulating layer 261, a silicon nitride film is formed as an example (see FIG. 9B).

In this embodiment, the protective insulating layer 261 is formed in such a manner that the substrate 201 after being subjected to the manufacturing process up to and including the step of forming the oxide insulating film 251 is heated at a temperature of 100° C. to 400° C., a sputtering gas containing high-purity nitrogen from which hydrogen and moisture are removed is introduced, and a target of a silicon semiconductor is used to form a silicon nitride film. In that case, the protective insulating layer 261 is preferably formed with moisture in a treatment chamber removed, in a similar manner to the case of forming the oxide insulating layer 251.

After the formation of the protective insulating layer 261, heat treatment may be further performed at a temperature higher than or equal to 100° C. and lower than or equal to 200° C. in the air for a period longer than or equal to 1 hour and shorter than or equal to 30 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. This is an example of the manufacturing process of the transistor.

As described using FIGS. 8A to 8C and FIGS. 9A and 9B, a transistor can be manufactured using an oxide semiconductor layer which is highly purified to be an I-type or a substantially I-type by heat treatment.

In addition, the highly purified oxide semiconductor layer includes extremely few carriers (close to zero) derived from an impurity (donor or acceptor) such as hydrogen; the carrier concentration is lower than $1\times10^{14}/cm^3$, preferably lower than $1\times10^{12}/cm^3$, far preferably lower than $1\times10^{11}/cm^3$. Therefore, the off-state current per 1 μm of channel width can be reduced to 10 aA ($1\times10^{-17}$ A) or less, further to 1 aA ($1\times10^{-18}$ A) or less, still further to 10 zA ($1\times10^{-20}$ A) or less.

For example, by using the transistor including the oxide semiconductor layer functioning as a channel formation layer in a pixel, change of a voltage applied to a capacitor functioning as a storage capacitor (e.g., the capacitor 102 shown in FIG. 1A, and the capacitor 502 and the capacitor which is electrically connected to the liquid crystal element in parallel shown in FIG. 5A) and a liquid crystal element, due to the off-state current of the transistor can be suppressed.

Embodiment 7

In Embodiment 7, an example of a transistor including a highly purified oxide semiconductor layer functioning as a channel formation layer will be described.

The off-state current of the transistor including a highly purified oxide semiconductor layer is less than or equal to $1\times10^{-13}$ A that is the detection limit of a measurement device, as described above. An element for evaluating the characteristics was manufactured and a value of the off-state current (a value of less than or equal to the detection limit of the measurement device as described above) was obtained with higher accuracy; the result thereof is described below.

Figure 10:
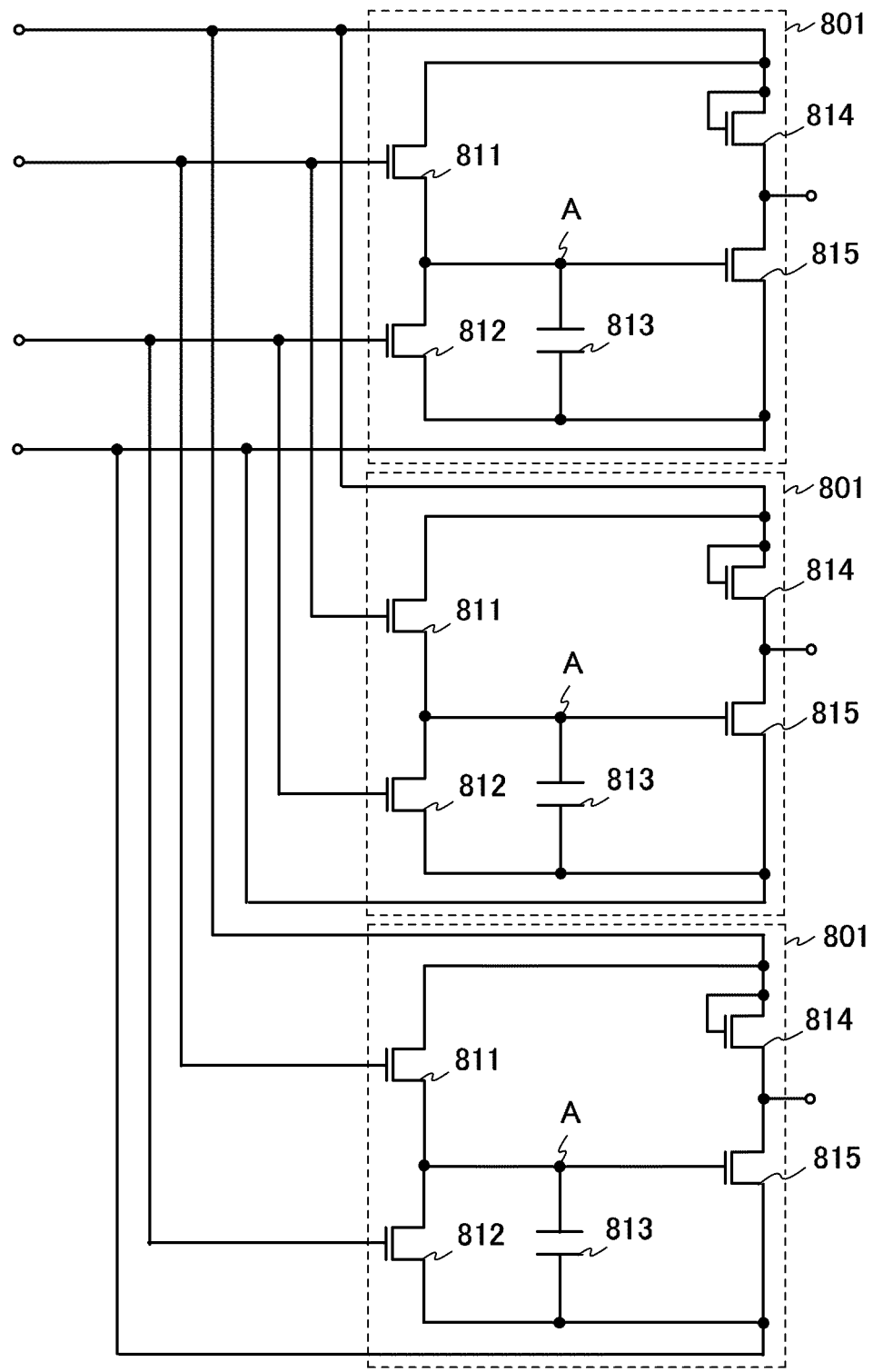
FIG. 10 is a circuit diagram showing a configuration of a characterization circuit used for current measurement in Embodiment 7.

A circuit for characteristic evaluation used in a method for measuring current is described using FIG. 10. FIG. 10 is a circuit diagram illustrating the configuration of the circuit for characteristic evaluation used in the method for measuring current.

The element for evaluating the characteristics shown in FIG. 10 includes three measurement systems 801. The three measurement systems 801 are electrically connected to one another in parallel.

The measurement system 801 includes a transistor 811, a transistor 812, a capacitor 813, a transistor 814, and a transistor 815. As an example, the transistors manufactured according to Embodiment 6 were used as the transistors 811 and 812.

A voltage V11 is input to one of a source and a drain of the transistor 811, and a voltage Vext_b1 is input to a gate of the transistor 811. The voltage Vext_b1 controls the transistor 811 to be turned on or off.

One of a source and a drain of the transistor 812 is electrically connected to the other of the source and the drain of the transistor 811, a voltage V12 is input to the other of the source and the drain of the transistor 812, and a voltage Vext_b2 is input to a gate of the transistor 812. The voltage Vext_b2 controls the transistor 812 to be turned on or off.

The capacitor 813 has two electrodes. One electrode of the two electrodes of the capacitor 813 is electrically connected to the other of the source and the drain of the transistor 811, and the other electrode of the capacitor 813 is electrically connected to the other of the source and the drain of the transistor 812.

The voltage V11 is input to one of a source and a drain of the transistor 814, and a gate of the transistor 814 is electrically connected to the one of the source and the drain of the transistor 814.

One of a source and a drain of the transistor 815 is electrically connected to the other of the source and the drain of the transistor 814, and the voltage V12 is input to the other of the source and the drain of the transistor 815. A portion where a third electrode of the capacitor 813, the other of the source and the drain of the transistor 811, the one of the source and the drain of the transistor 812, and a gate of the transistor 815 are connected to one another is also referred to as a node A.

The measurement system 801 outputs a voltage at a potion where the other of the source and the drain of the transistor 814 is connected to the one of the source and the drain of the transistor 815, as an output voltage Vout.

Next, the method for measuring current with the measurement system shown in FIG. 10 is described.

First, an initializing period in which a potential difference is given to measure the off-state current is briefly described. In the initializing period, the value of the voltage Vext_b1 is set to a value with which the transistor 811 is turned on, so that the transistor 811 is turned on to apply the voltage V11 to the node A. In this embodiment, the voltage V11 is a high power-source voltage Vdd, for example. In addition, the transistor 812 is turned off.

After that, the voltage Vext_b1 is set to a value with which the transistor 811 is turned off, so that the transistor 811 is turned off. Further, after the transistor 811 is turned off, the voltage V11 is set to a low power-source voltage Vss. The transistor 812 is kept in the off state. The voltage V12 is set to be equal to the voltage V11. Accordingly, the initializing period is ended. In the state where the initial period is ended, a potential difference is generated between the node A and the one of the source and the drain of the transistor 811 and a potential difference is generated between the node A and the other of the source and the drain of the transistor 812. Therefore, charge flows slightly through the transistor 811 and the transistor 812. That is, the off-state current flows.

The high power-source voltage Vdd is a voltage the value of which is relatively higher than that of the low power-source voltage Vss, whereas the low power-source voltage Vss is a voltage the value of which is relatively lower than that of the high power-source voltage Vdd.

Next, a measuring period of the off-state current is briefly described. In the measuring period, a potential difference between the one of the source and the drain of the transistor 811 and the other of the source and the drain of the transistor 812 is fixed to the low power-source voltage Vss. On the other hand, in the measuring period, the potential of the node A is not fixed (is made in a floating state). Accordingly, current flows between the source and the drain of the transistor 812, so that the amount of electric charge accumulated in the node A changes over time. Further, as the amount of electric charge in the node A changes, the voltage of the node A changes. That is, the output voltage Vout also changes.

Figure 11:
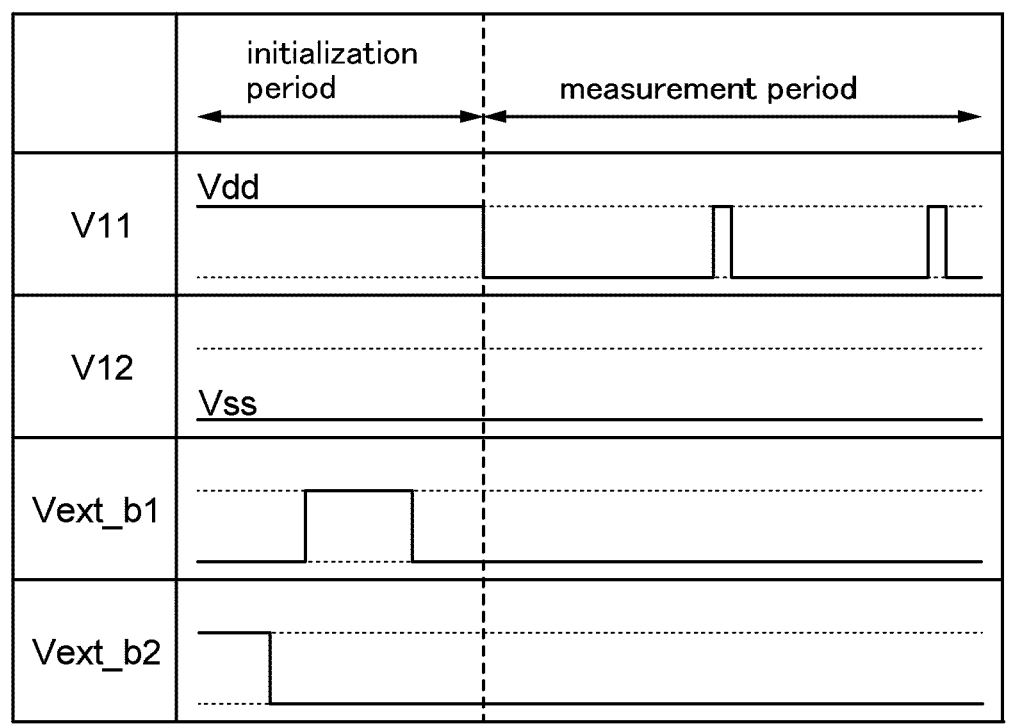
FIG. 11 is a timing chart illustrating a relationship of voltages in an initialization period and a subsequent measurement period in the characterization circuit shown in FIG. 10.

Relationship between the voltages in the initializing period and the following measuring period is described using FIG. 11. FIG. 11 is a timing chart illustrating the relationship between the voltages in the initializing period and the following measuring period.

As shown in FIG. 11, in the initializing period, the voltage Vext_b2 is set to a value with which the transistor 812 is turned on, first. Accordingly, the voltage of the node A is set to a value equivalent to the voltage V12. After that, the voltage Vext_b2 is changed to a value with which the transistor 812 is turned off, so that the transistor 812 is turned off. In addition, the voltage Vext_b1 is set to a value with which the transistor 811 is turned on. Accordingly, the voltage of the node A is set to a value equivalent to the voltage V11. After that, the voltage Vext_b1 is changed to a value with which the transistor 811 is turned off. Accordingly, the node A is made in a floating state, whereby the initializing period is ended.

In the measuring period after the initializing period, the voltage V11 and the voltage V12 are set such that electric charge flows to the node A or electric charge flows out of the node A. In this embodiment, a potential difference between the voltage V11 and the voltage V12 is set to the low power-source voltage Vss. Note that at the timing at which the output voltage Vout is measured, it is necessary to operate an output circuit and thus temporarily make the voltage V11 a high power-source voltage Vdd in some cases. The period in which the voltage V11 is the high power-source voltage Vdd is made as short as the measurement is not affected.

With the potential difference given and the measuring period is started in this manner, the amount of electric charge accumulated at the node A changes over time, which causes the voltage of the node A to change. This means that the voltage of the gate of the transistor 815 varies and thus, the output voltage Vout also changes over time.

A method for calculating the off-state current on the basis of the obtained output voltage Vout is described below.

The relationship between a voltage $V_A$ of the node A and the output voltage Vout is obtained before calculation of the off-state current. Thus, the voltage $V_A$ of the node A can be obtained from the output voltage Vout. In accordance with the above relationship, the voltage $V_A$ of the node A can be expressed as a function of the output voltage Vout by the following formula.

$$V_A = F(Vout) \quad \text{[FORMULA 1]}$$

Electric charge QA of the node A can be expressed by the following formula using the voltage $V_A$ of the node A, capacitance $C_A$ connected to the node A, and a constant (const). Here, the capacitance $C_A$ connected to the node A is the sum of capacitance of the capacitor 813 and the other capacitance.

$$Q_A = C_A V_A + \text{const} \quad \text{[FORMULA 2]}$$

Current $I_A$ of the node A is a temporal differential of electric charge which flows to the node A (or electric charge which flows out of the node A) and thus is expressed by the following formula.

$$I_A \equiv \frac{\Delta Q_A}{\Delta t} = \frac{C_A \cdot \Delta F(Vout)}{\Delta t} \quad \text{[FORMULA 3]}$$

In this manner, the current $I_A$ of the node A can be obtained using the capacitance $C_A$ electrically connected to the node A and the output voltage Vout.

In accordance with the above method, it is possible to measure off-state current of a transistor in an off state.

In this embodiment, the transistor 811 and the transistor 812 were manufactured using a highly purified oxide semiconductor layer. The ratio of the channel length (L) to the channel width (W) of each transistor was L/W=1/5. In addition, in the measurement systems 801 which were arranged in parallel, values of the capacitance of the capacitors 813 were 100 fF, 1 pF, and 3 pF.

In the measurement of this embodiment, the high power-source voltage Vdd was set to 5 V and the low power-source voltage Vss was set to 0 V. In the measuring period, the output voltage Vout was measured with the voltage V11 which was basically set to the low power-source voltage Vss and changed to the high power-source voltage Vdd only for 100 msec at intervals of 10 sec to 300 sec. The denominator Δt which was used in calculation of current I which flows through the element was about 30000 sec.

Figure 12:
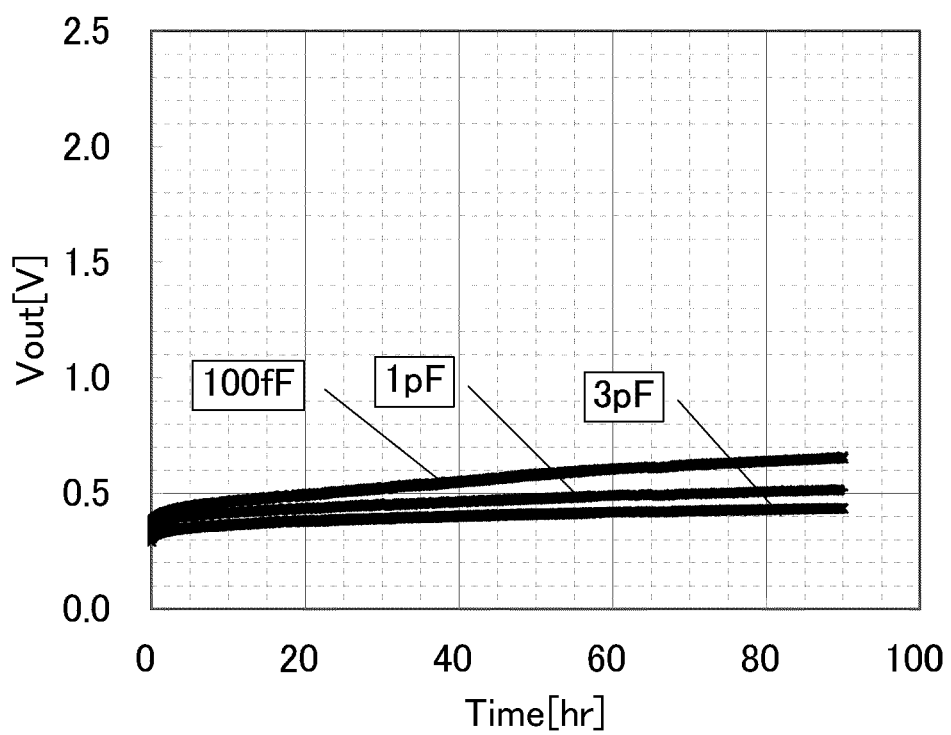
FIG. 12 is a graph showing output voltage vs. elapsed time of the current measurement in Embodiment 7.

FIG. 12 shows characteristics of elapsed time Time in measuring the current vs. the output voltage Vout. The potential change can be observed with a measurement for about 90 hours.

Figure 13:
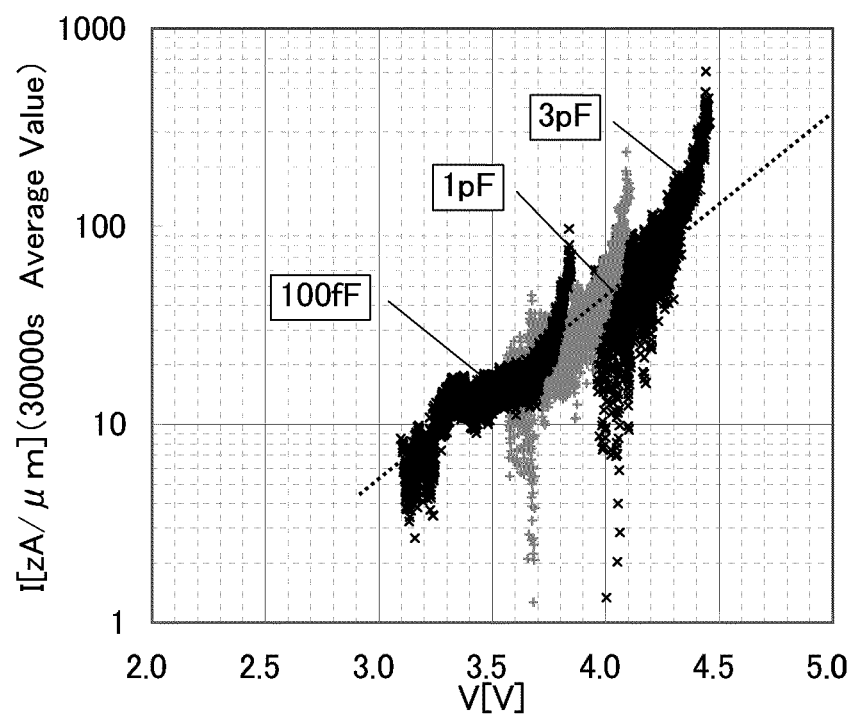
FIG. 13 is a graph showing an off-state current of a transistor calculated with the current measurement in Embodiment 7.

FIG. 13 shows the off-state current calculated on the basis of the above-described current measurement. FIG. 13 shows characteristics of source-drain voltage V vs. off-state current I of the transistor. Referring to FIG. 13, it is found that the off-state current is about 40 zA/μm at a source-drain voltage of 4 V. It is also found that the off-state current is 10 zA/μm or less at a source-drain voltage of 3.1 V. Note that 1 zA represents $10^{-21}$ A.

Figure 14:
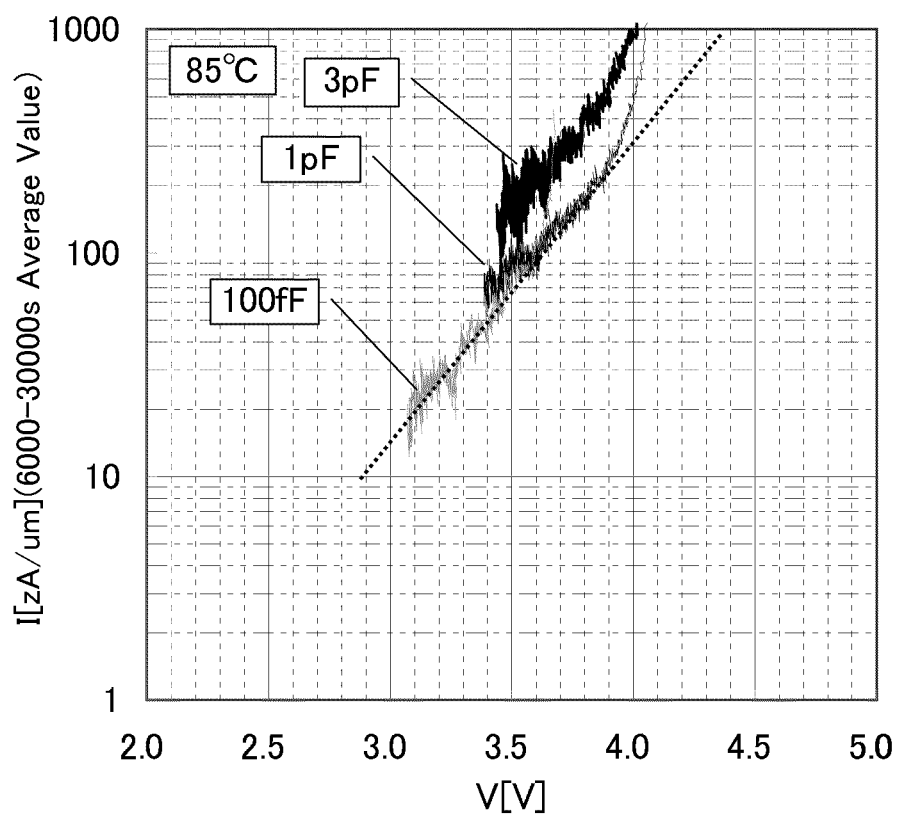
FIG. 14 is a graph showing a relationship of off-state current of a transistor vs. source-drain voltage at 85° C.

FIG. 14 shows the off-state current which was calculated in the above measurement of the current at a temperature of the transistor of 85° C. FIG. 14 shows characteristics of a source-drain voltage V at 85° C. vs. the off-state current I of the transistor. Referring to FIG. 14, it is found that the off-state current of the transistor is 100 zA/μm or less at the source-drain voltage of 3.1 V.

In this manner, it was confirmed that the off-state current can be sufficiently small in a transistor including a highly purified oxide semiconductor.

Embodiment 8

In Embodiment 8, a structural example of a field-sequential display device will be further described.

Figure 15:
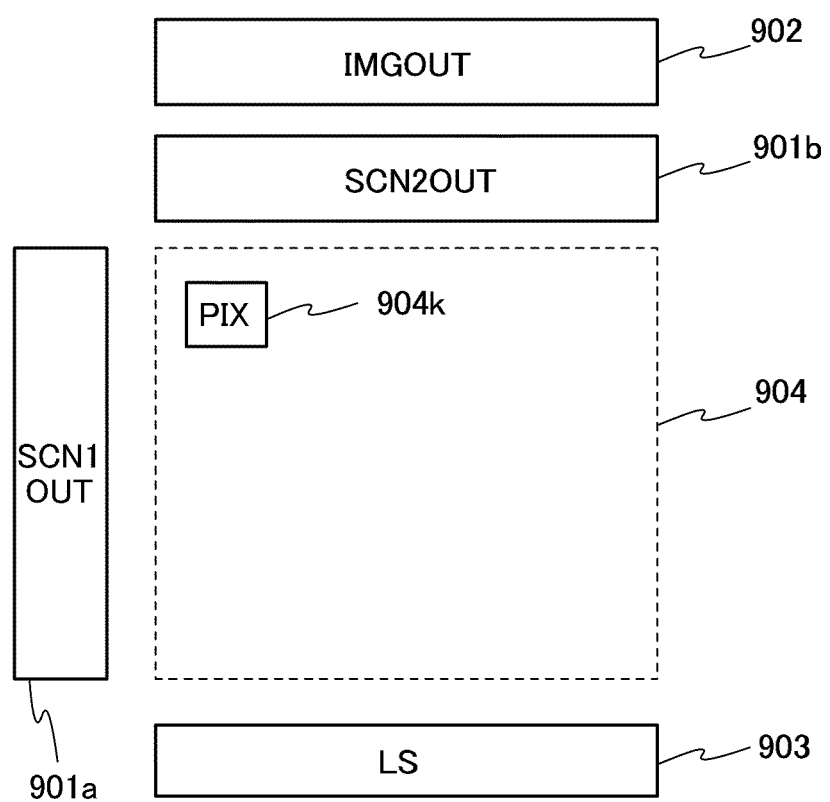
FIG. 15 is a block diagram illustrating a structural example of a display device in Embodiment 8.

The structural example of the display device in this embodiment is described using FIG. 15. FIG. 15 is a block diagram illustrating the structural example of the display device in this embodiment.

A display device shown in FIG. 15 includes a first scan signal output circuit (also called SCN1OUT) 901a, a second scan signal output circuit (also called SCN2OUT) 901b, an image signal output circuit (IMGOUT) 902, a light source portion 903, and a pixel 904k.

The first scan signal output circuit 901a functions to output a scan signal SCN11.

The second scan signal output circuit 901b functions to output a scan signal SCN12. The arrangement of the second scan signal output circuit 901b is not limited to that in FIG. 15.

The first scan signal output circuit 901a and the second scan signal output circuit 901b can be manufactured by the same manufacturing process as pixels. The manufacturing process can be thus simplified.

The image signal output circuit 902 functions to output an image signal IMG. The image signal output circuit 902 outputs the image signal IMG to the pixel 904k selected by the first scan signal output circuit 901a. For example, a shift register and an analog switch are included in the image signal output circuit 902.

The light source portion 903 functions to make light to enter a pixel portion 904. As the light source portion 903, a backlight, a sidelight, a front light, or the like can be used. The light source portion 903 includes a light source and a light source control circuit for controlling operation of the light source, for example. As the light source, light sources for colors of R, G, and B or light sources for colors of cyan, magenta, and yellow can be used. As the light source, a light-emitting element (e.g., a light-emitting diode) can be used, for example. It is preferable that the light source portion can switch the color of the light source per unit time. A light-emitting element (e.g., an LED) that emits white light can be used as the light source in addition to the light sources for the above-described colors.

As the pixel 904k, a pixel having the structure shown in the display device described in the above embodiment can be applied. With the pixel 904k, the scan signal SCN11 and the scan signal SCN12 are input through a scan signal line, and the image signal IMG is input through an image signal line in accordance with the scan signal SCN11 and a display in accordance with the image signal IMG is performed in accordance with the scan signal SCN12.

As described using FIG. 15, the display device of this embodiment includes the first scan signal output circuit, the second scan signal output circuit, the image signal output circuit, the light source portion, and the pixel. With this structure, the color of light which enters the pixel portion is changed per subframe period by the light source portion, so that a field-sequential driving can be performed.

In the case where a reset transistor is provided for the pixel as described in Embodiment 4, a third scan signal output circuit for outputting a scan signal SCN13 may be provided for a gate of the reset transistor.

Embodiment 9

In Embodiment 9, an electronic device provided with the field-sequential display device of the above embodiment will be described.

Structural examples of the electronic device in this embodiment are described using FIGS. 16A to 16F. FIGS. 16A to 16F are views each illustrating a structural example of the electronic device in this embodiment.

Figure 16A:
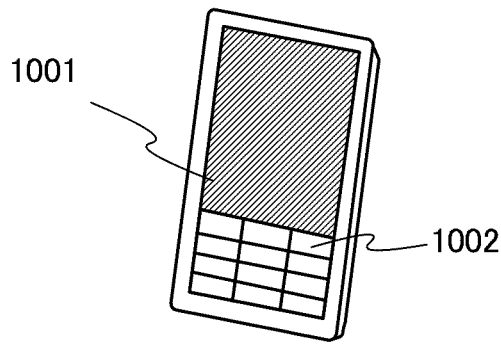
FIGS. 16A to 16F are views illustrating structural examples of an electronic device in Embodiment 9.

An electronic device illustrated in FIG. 16A is a personal digital assistant. The personal digital assistant illustrated in FIG. 16A includes at least a display portion 1001. With the field-sequential display device of the above embodiment applied in the display portion 1001, the operation speed of the personal digital assistant can be improved.

Figure 16D:
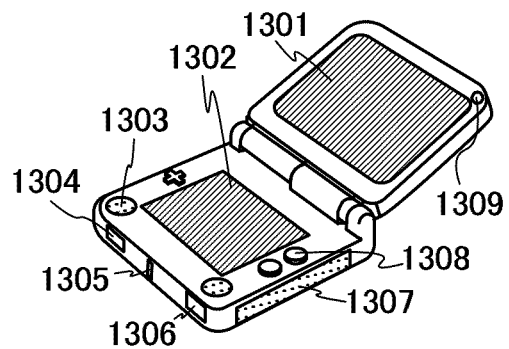
Figure 16B:
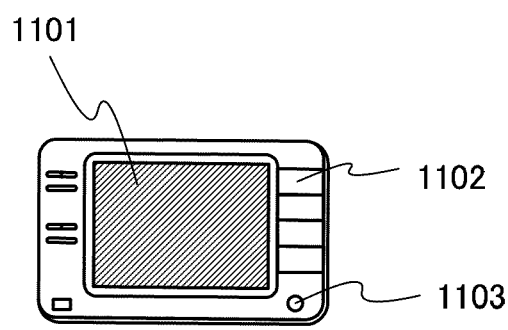

An electronic device illustrated in FIG. 16B is an information guide terminal including an automotive navigation system, for example. The information guide terminal illustrated in FIG. 16B includes at least a display portion 1101. The information guide terminal illustrated in FIG. 16B can also include operation buttons 1102 and an external input terminal 1103. With the field-sequential display device of the above embodiment applied in the display portion 1101, the operation speed of the information guide terminal can be improved.

Figure 16E:
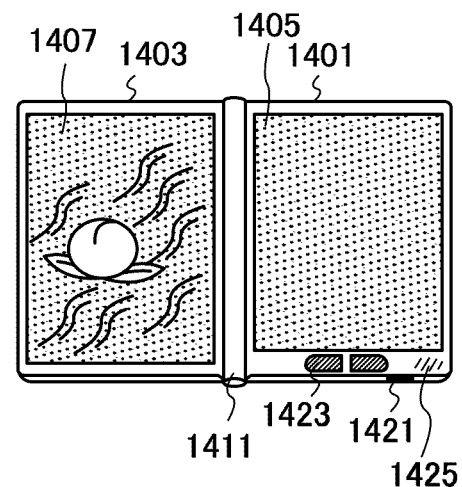
Figure 16C:
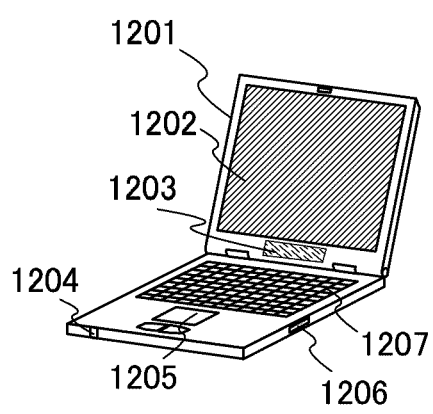

An electronic device illustrated in FIG. 16C is a laptop personal computer. The laptop personal computer illustrated in FIG. 16C includes a housing 1201, a display portion 1202, a speaker 1203, an LED lamp 1204, a pointing device 1205, a connection terminal 1206, and a keyboard 1207. With the field-sequential display device of the above embodiment applied in the display portion 1202, the operation speed of the laptop personal computer can be improved.

An electronic device illustrated in FIG. 16D is a portable game machine. The portable game machine illustrated in FIG. 16D includes a display portion 1301, a display portion 1302, a speaker 1303, a connection terminal 1304, an LED lamp 1305, a microphone 1306, a recording medium reading portion 1307, operation buttons 1308, and a sensor 1309. With the field-sequential display device of the above embodiment applied in the display portion 1301, the operation speed of the portable game machine can be improved.

An electronic device illustrated in FIG. 16E is an e-book reader. The e-book reader illustrated in FIG. 16E includes at least a housing 1401, a housing 1403, a display portion 1405, a display portion 1407, and a hinge 1411.

The housing 1401 and the housing 1403 are connected by the hinge 1411 so that the e-book reader illustrated in FIG. 16E can be opened and closed with the hinge 1411 as an axis. With such a structure, the e-book reader can be handled like a paper book. The display portion 1405 is incorporated in the housing 1401 and the display portion 1407 is incorporated in the housing 1403. The display portion 1405 and the display portion 1407 may display different images. For example, one image can be displayed across both the display portions. According to the structure where different images are displayed on the display portion 1405 and the display portion 1407, for example, the right display portion (the display portion 1405 in FIG. 16E) can display text and the left display portion (the display portion 1407 in FIG. 16E) can display an image.

In addition, the e-book reader illustrated in FIG. 16E may be provided with an operation portion or the like for the housing 1401 or the housing 1403. For example, the e-book reader illustrated in FIG. 16E may include a power switch 1421, operation keys 1423, and a speaker 1425. The control keys 1423 in the e-book reader illustrated in FIG. 16E enables pages of an image across the plurality of pages to be turned. In the e-book reader illustrated in FIG. 16E, both the display portion 1405 and the display portion 1407, or either the display portion 1405 or the display portion 1407 may be provided with a keyboard, a pointing device, or the like. Also in the e-book reader illustrated in FIG. 16E, an external connection terminal (an earphone terminal, a USB terminal, a terminal connectable to a variety of cables such as an AC adapter and a USB cable, or the like), a recording medium insertion portion, or the like may be provided on the back surface or side surface of the housing 1401 and/or the housing 1403. The e-book reader illustrated in FIG. 16E may have a function of an electronic dictionary.

The field-sequential display device of the above embodiment may be mounted on the display portion 1405 and/or the display portion 1407. With the field-sequential display device of the above embodiment applied in the display portion 1405 and/or the display portion 1407, the operation speed of the e-book reader can be improved.

The e-book reader illustrated in FIG. 16E may be capable of transmitting and receiving data by wireless communication. With such a structure, desired book data or the like can be purchased and downloaded from an electronic book server.

Figure 16F:
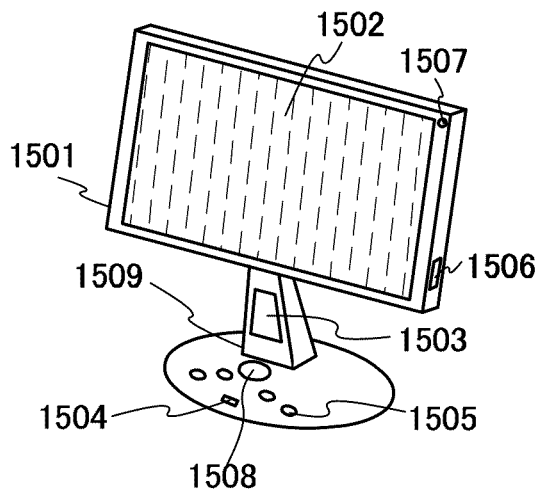

An electronic device illustrated in FIG. 16F is a display. The display illustrated in FIG. 16F includes a housing 1501, a display portion 1502, a speaker 1503, an LED lamp 1504, operation buttons 1505, a connection terminal 1506, a sensor 1507, a microphone 1508, and a support base 1509. With the field-sequential display device of the above embodiment applied in the display portion 1502, the operation speed of the display can be improved.

Figure 17:
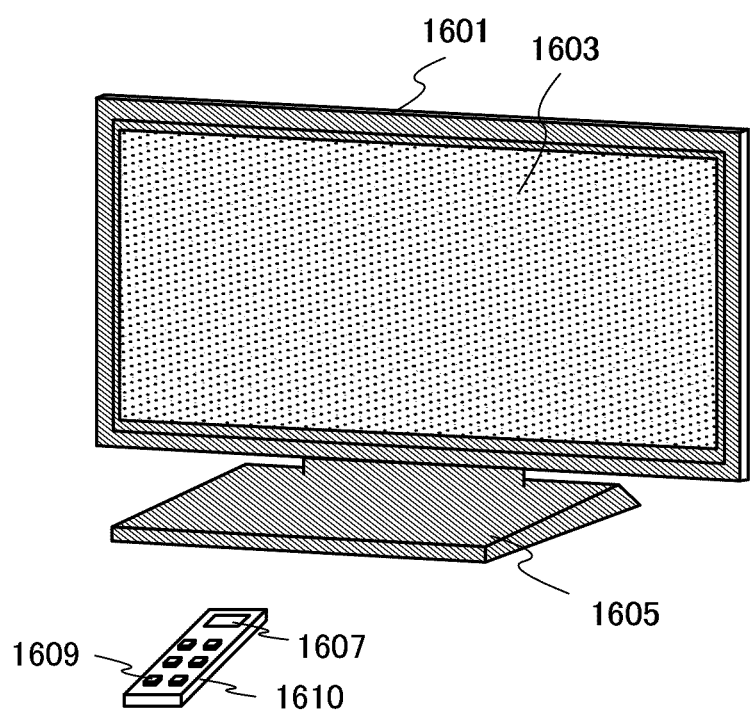
FIG. 17 is a view illustrating a structural example of the electronic device in Embodiment 9.

An electronic device illustrated in FIG. 17 is a television device. The television device illustrated in FIG. 17 includes a housing 1601 and a display portion 1603. The display portion 1603 is incorporated in the housing 1601. The television device illustrated in FIG. 17 can display an image on the display portion 1603. The housing 1601 in the television device illustrated in FIG. 17 is supported by a stand 1605, which is an example. With the field-sequential display device of the above embodiment applied in the display portion 1603, the operation speed of the television device can be improved.

As shown in FIG. 17, the television device illustrated in FIG. 17 can be operated by an operation switch provided for the housing 1601 or a separate remote controller 1610. With an operational key 1609 of the remote controller 1610, the channel and volume of the television device illustrated in FIG. 17 can be controlled, so that an image displayed on the display portion 1603 can be controlled. A display portion 1607 for displaying data output from the remote controller 1610 may be provided for the remote controller 1610.

The television device illustrated in FIG. 17 may be provided with a receiver, a modem, and the like. With the use of the receiver, general television broadcasting can be received. In addition, the television device can be connected to a communication network by wired or wireless connection via the modem, thereby performing one-way (from sender to receiver) or two-way (between sender and receiver, between receivers, or the like) data communication.

The electronic device of this embodiment may have a power source including a solar battery cell, a power storage for charging voltage that is output from the solar battery cell, and a DC converter for converting a voltage charged in the power storage into respective voltages appropriate for circuits. Accordingly, an external power supply is not needed, and the electronic device can be used for a long period of time even at a place with no external power supply, improving the convenience of the electronic device.

In the electronic device of this embodiment, a display portion may have a touch panel function. The touch panel function can be added by mounting a touch panel unit on the display portion or by providing an optical detection circuit for a pixel.

With the field-sequential display device of the above embodiment applied in the display portion of the electronic device, the operation speed of the electronic device can be improved.

This application is based on Japanese Patent Application serial No. 2010-083345 filed with Japan Patent Office on Mar. 31, 2010, the entire contents of which are hereby incorporated by reference.

What is claimed is:

1. A field-sequential display device comprising:
an image signal line comprising a first conductive layer;
a first scan signal line;
a second scan signal line comprising a second conductive layer;
a first transistor comprising a first source, a first drain, and a first gate, in which an image signal is input to one of the first source and the first drain through the image signal line and a first scan signal is input to the first gate through the first scan signal line;
a second transistor comprising a second source, a second drain, and a second gate, in which one of the second source and the second drain is electrically connected to the other of the first source and the first drain of the first transistor and a second scan signal is input to the second gate through the second scan signal line; and
a liquid crystal element which comprises a first electrode, a second electrode, and a liquid crystal layer which is applied with a voltage by the first and second electrodes, in which the first electrode is electrically connected to the other of the second source and the second drain of the second transistor,
wherein the first conductive layer and the second conductive layer are substantially parallel to each other, and
wherein the first conductive layer and the second conductive layer are not overlapped with each other.

2. The field-sequential display device according to claim 1, wherein the first transistor and the second transistor comprise an oxide semiconductor layer.

3. The field-sequential display device according to claim 2, wherein the oxide semiconductor layer has a carrier concentration of $1\times10^{14}/\mathrm{cm}^3$ or less.

4. The field-sequential display device according to claim 2, wherein the oxide semiconductor layer includes a crystalline region.

5. The field-sequential display device according to claim 1, further comprising a storage capacitor comprising a third electrode, a fourth electrode, and a dielectric layer, in which the third electrode is electrically connected to the other of the first source and the first drain of the first transistor and an electric charge is accumulated by applying a voltage between the third electrode and the fourth electrode.

6. A field-sequential display device comprising:
an image signal line comprising a first conductive layer;
a first scan signal line;
a second scan signal line comprising a second conductive layer;
a third scan signal line comprising a third conductive layer;
a first transistor comprising a first source, a first drain, and a first gate, in which an image signal is input to one of the first source and the first drain through the image signal line and a first scan signal is input to the first gate through the first scan signal line;
a second transistor comprising a second source, a second drain, and a second gate, in which one of the second source and the second drain is electrically connected to the other of the first source and the first drain of the first transistor and a second scan signal is input to the second gate through the second scan signal line;
a liquid crystal element which comprises a first electrode, a second electrode, and a liquid crystal layer which is applied with a voltage by the first and second electrodes, in which the first electrode is electrically connected to the other of the second source and the second drain of the second transistor; and
a third transistor comprising a third source, a third drain, and a third gate, in which a reset voltage is input to one of the third source and the third drain, the other of the third source and the third drain is electrically connected to the first electrode of the liquid crystal element, and a third scan signal is input to the third gate through the third scan signal line,
wherein the first conductive layer and the second conductive layer are substantially parallel to each other, and
wherein the first conductive layer and the second conductive layer are not overlapped with each other.

7. The field-sequential display device according to claim 6, wherein the first transistor, the second transistor, and the third transistor comprise an oxide semiconductor layer.

8. The field-sequential display device according to claim 7, wherein the oxide semiconductor layer has a carrier concentration of $1\times10^{14}/\mathrm{cm}^3$ or less.

9. The field-sequential display device according to claim 7, wherein the oxide semiconductor layer includes a crystalline region.

10. The field-sequential display device according to claim 6, further comprising a storage capacitor comprising a third electrode, a fourth electrode, and a dielectric layer, in which the third electrode is electrically connected to the other of the first source and the first drain of the first transistor and an electric charge is accumulated by applying a voltage between the third electrode and the fourth electrode.

11. The field-sequential display device according to claim 6, wherein the first conductive layer functions as a wiring to which the reset voltage is input.

12. A field-sequential display device comprising:
an image signal line comprising a first conductive layer;
a first scan signal line;
a second scan signal line comprising a second conductive layer;
a first transistor comprising a first source, a first drain, and a first gate, in which an image signal is input to one of the first source and the first drain through the image signal line and a first scan signal is input to the first gate through the first scan signal line;
a second transistor comprising a second source, a second drain, and a second gate, in which one of the second source and the second drain is electrically connected to the other of the first source and the first drain of the first transistor and a second scan signal is input to the second gate through the second scan signal line; and
a liquid crystal element which comprises a first electrode, a second electrode, and a liquid crystal layer which is applied with a voltage by the first and second electrodes, in which the first electrode is electrically connected to the other of the second source and the second drain of the second transistor,
wherein the first conductive layer and the second conductive layer are substantially parallel to each other,
wherein the first conductive layer and the second conductive layer are not overlapped with each other, and
wherein the first transistor and the second transistor comprise an oxide semiconductor layer.

13. The field-sequential display device according to claim 12, wherein the oxide semiconductor layer has a carrier concentration of $1\times10^{14}/cm^3$ or less.

14. The field-sequential display device according to claim 12, wherein the oxide semiconductor layer includes a crystalline region.

15. The field-sequential display device according to claim 12, further comprising a storage capacitor comprising a third electrode, a fourth electrode, and a dielectric layer, in which the third electrode is electrically connected to the other of the first source and the first drain of the first transistor and an electric charge is accumulated by applying a voltage between the third electrode and the fourth electrode.

16. A field-sequential display device comprising:
an image signal line comprising a first conductive layer;
a first scan signal line;
a second scan signal line comprising a second conductive layer;
a third scan signal line comprising a third conductive layer;
a first transistor comprising a first source, a first drain, and a first gate, in which an image signal is input to one of the first source and the first drain through the image signal line and a first scan signal is input to the first gate through the first scan signal line;
a second transistor comprising a second source, a second drain, and a second gate, in which one of the second source and the second drain is electrically connected to the other of the first source and the first drain of the first transistor and a second scan signal is input to the second gate through the second scan signal line;
a liquid crystal element which comprises a first electrode, a second electrode, and a liquid crystal layer which is applied with a voltage by the first and second electrodes, in which the first electrode is electrically connected to the other of the second source and the second drain of the second transistor; and
a third transistor comprising a third source, a third drain, and a third gate, in which a reset voltage is input to one of the third source and the third drain, the other of the third source and the third drain is electrically connected to the first electrode of the liquid crystal element, and a third scan signal is input to the third gate through the third scan signal line,
wherein the first conductive layer and the second conductive layer are substantially parallel to each other,
wherein the first conductive layer and the second conductive layer are not overlapped with each other, and
wherein the first transistor, the second transistor, and the third transistor comprise an oxide semiconductor layer.

17. The field-sequential display device according to claim 16, wherein the oxide semiconductor layer has a carrier concentration of $1\times10^{14}/cm^3$ or less.

18. The field-sequential display device according to claim 16, wherein the oxide semiconductor layer includes a crystalline region.

19. The field-sequential display device according to claim 16, further comprising a storage capacitor comprising a third electrode, a fourth electrode, and a dielectric layer, in which the third electrode is electrically connected to the other of the first source and the first drain of the first transistor and an electric charge is accumulated by applying a voltage between the third electrode and the fourth electrode.

20. The field-sequential display device according to claim 16, wherein the first conductive layer functions as a wiring to which the reset voltage is input.

* * * * *